(12) United States Patent
Yamazaki

(10) Patent No.: US 7,417,373 B2
(45) Date of Patent: Aug. 26, 2008

(54) LIGHT EMITTING DEVICE, ELECTRONIC DEVICE, AND TELEVISION DEVICE

(75) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 304 days.

(21) Appl. No.: 11/090,157

(22) Filed: Mar. 28, 2005

(65) Prior Publication Data

US 2005/0225238 A1 Oct. 13, 2005

(30) Foreign Application Priority Data

Apr. 7, 2004 (JP) ............................. 2004-112801

(51) Int. Cl.
*H01J 1/62* (2006.01)
(52) U.S. Cl. ...................................... 313/506; 313/504
(58) Field of Classification Search .................... None
See application file for complete search history.

(56) References Cited

U.S. PATENT DOCUMENTS

| | | | |
|---|---|---|---|
| 5,200,846 A | 4/1993 | Hiroki et al. | |
| 5,637,515 A | 6/1997 | Takemura | |
| 5,838,508 A | 11/1998 | Sugawara | |
| 6,358,766 B1 | 3/2002 | Kasahara | |
| 6,512,271 B1 | 1/2003 | Yamazaki et al. | |
| 6,515,310 B2 | 2/2003 | Yamazaki et al. | |
| 6,528,824 B2 | 3/2003 | Yamagata et al. | |
| 6,605,826 B2 | 8/2003 | Yamazaki et al. | |
| 6,677,059 B2* | 1/2004 | Shirakawa et al. | ......... 428/690 |
| 6,815,723 B2 | 11/2004 | Yamazaki et al. | |
| 6,858,878 B2 | 2/2005 | Yamazaki et al. | |
| 7,151,017 B2 | 12/2006 | Ohnuma | |
| 7,199,520 B2* | 4/2007 | Fujii et al. | ................... 313/506 |
| 2002/0000561 A1 | 1/2002 | Yamagata et al. | |
| 2002/0030193 A1 | 3/2002 | Yamazaki et al. | |
| 2003/0146446 A1 | 8/2003 | Yamazaki et al. | |
| 2004/0007973 A1 | 1/2004 | Utsumi | |
| 2004/0027055 A1* | 2/2004 | Yamazaki et al. | ........... 313/498 |

(Continued)

FOREIGN PATENT DOCUMENTS

EP 1 381 095 1/2004

(Continued)

OTHER PUBLICATIONS

"All-Organic Active Matrix OLD Display", Lisong Zhou, Sungkyu Park, Bo Bai, Jie Sun, Sheng-Chu Wu, T.N. Jackson, Shelby Nelson, Diane Freeman, Yongtaek Hong, IEEE Electron Devices Society, Jun. 20, 2005-Jun. 22, 2005.*

*Primary Examiner*—Vip Patel
(74) *Attorney, Agent, or Firm*—Eric J. Robinson; Robinson Intellectual Property Law Office, P.C.

(57) ABSTRACT

A full-color flat panel display using emission colors of red, green, and blue is increasingly required to have higher definition, higher aperture ratio and higher reliability. A light emitting device of the invention has an insulator referred to as a bank, that is, a black matrix (BM), between pixels on a substrate side where a light emitting element and a TFT are disposed, and has colored layers of red, green, and blue on a sealing substrate side. This enables right and left margins of a pixel to be taken and a width of the bank to be 30 μm or less, preferably, 5 μm to 20 μm.

21 Claims, 11 Drawing Sheets

U.S. PATENT DOCUMENTS

| | | |
|---|---|---|
| 2004/0061136 A1* | 4/2004 | Tyan et al. .................. 257/200 |
| 2004/0135503 A1* | 7/2004 | Handa et al. ................ 313/511 |
| 2004/0245531 A1* | 12/2004 | Fuji et al. .................... 257/88 |
| 2005/0001541 A1 | 1/2005 | Yamazaki et al. |
| 2005/0072977 A1 | 4/2005 | Saito et al. |

FOREIGN PATENT DOCUMENTS

| | | | |
|---|---|---|---|
| JP | 08-078329 | | 3/1996 |
| JP | 11067445 A | * | 3/1999 |
| JP | 2002-033185 | | 1/2002 |
| JP | 2002-083689 | | 3/2002 |
| JP | 2003-017272 | | 1/2003 |
| JP | 2004-031201 | | 1/2004 |
| JP | 2004-047194 | | 2/2004 |

* cited by examiner

LIGHT EMITTING DEVICE, ELECTRONIC DEVICE, AND TELEVISION DEVICE

BACKGROUND OF THE INVENTION

1. Field of the Invention

The present invention relates to a semiconductor device having a circuit including a thin film transistor (hereinafter, referred to as a TFT) and a manufacturing method thereof. For example, the invention relates to an electronic device equipped with a light emitting display device having a TFT and an organic light emitting element, as a part.

Note that in this specification, a semiconductor device means overall devices which can function by using semiconductor properties. An electro-optical device, a semiconductor circuit and an electronic device are all included in the semiconductor device.

2. Description of the Related Art

Recently, research on a light emitting device having an EL element as a self-luminous light emitting element has been activated. This light emitting device is also referred to as an organic EL display or an organic light emitting diode. The light emitting device has characteristics such as fast response speed suitable for movie display, or low voltage and low power consumption driving. Therefore, the light emitting device draws attention as a next generation display including a new-generation portable telephone or a personal digital assistance (PDA).

An EL element has a structure in which a layer containing organic compound (hereinafter, referred to as an EL layer), adopted as an emission layer, is interposed between an anode and a cathode. Electroluminescence is produced from the EL layer by applying an electric field to the anode and the cathode.

A low-molecular weight material or a high-molecular weight material can be used for the EL layer in the EL element. A vapor deposition (including a vacuum vapor deposition), a spin coating method, an ink-jet method, a dip method, an electric field polymerization method, or the like is employed as a method for forming the EL layer.

In the case of manufacturing a full-color flat panel display using emission colors of red (R), green (G), and blue (B), a space between different pixels is designed to be wide or an insulator referred to as a bank (or a barrier) is disposed between pixels since the film formation by the above-described film formation method is not so accurate.

In the patent document 1, the applicant describes a structure in which a light-extraction efficiency is improved by disposing a light shielding portion on the edge of an EL element to shield light to be emitted from a transparent electrode to the light shielding portion. Note that in the patent document 1, a light emitting device having a bottom emission structure is described. (Patent Document 1: Japanese Patent Application Laid-Open No. 2002-83689)

In the patent document 2, the applicant proposes to prevent reflected light by a wiring from reaching eyes of an observer by using a light-absorbing multilayer film as a top layer of a bank and using an organic resin as a bottom layer. Note that in the patent document 2, a light emitting device having a top emission structure is described. (Patent Document 2: Japanese Patent Application Laid-Open No. 2004-31201)

In addition, in the patent document 3, the applicant describes a structure in which a shielding film is disposed adjacent to an anode or a cathode of a light emitting element in order to prevent an EL light emitting device from having a mirror surface without using a circularly-polarizing film. Note that in the patent document 3, a light emitting device having a top emission structure and a bottom emission structure is described. (Patent Document 3: Japanese Patent Application Laid-Open No. 2002-33185)

A full-color flat panel display using emission colors of red, green, and blue is increasingly required to have higher definition, higher aperture ratio, and higher reliability. Such requirements a are a major object in miniaturizing each display pixel pitch to make a light emitting device highly precise (increasing the number of pixels) and downsized. Simultaneously, increasing the productivity and lowering the cost are required.

SUMMARY OF THE INVENTION

It is an object of the invention to provide an active-matrix light emitting device using a light emitting element and a colored layer. A light emitting device of the invention has an insulator referred to as a bank (or a barrier) to be a black matrix (BM) between pixels on a substrate side where a light emitting element and a TFT are disposed, and has colored layers of red, green, and blue on a sealing substrate side. This enables right and left margins of a pixel to be taken and a width of a bank to be 30 μm or less, preferably, 5 μm to 20 μm.

A so-called color filter is formed of colored layers of red, green, and blue regularly arranged over a substrate integrated with a black matrix adjacent arranged therebetween. In the case of forming a color filter by a printing method, a colored layer and a black matrix overlap partly and a thick part to be depressions on the surface is formed if a black matrix is formed, and thereafter, colored layers of red, green, and blue are formed so as not to make an empty space. In addition, a partially overlapped part is made and a thick part is also formed even if colored layers of red, green, and blue are first formed and a black matrix is then formed. Therefore, the conventional color filter has a transparent layer referred to as an overcoat layer for making the depressions flat. The overcoat layer increases a total thickness of a color filter.

According to the invention, a viewing angle can be made wide by narrowing a space between a substrate having a light emitting element and a TFT and a sealing substrate having a colored layer to reduce a distance between the colored layer and the light emitting element. Note that a dimension of one colored layer is preferably larger than that of a light emitting region (a region surrounded with a bank) of one light emitting element.

Specifically, in the invention, a structure on a sealing substrate side and a manufacturing process thereof are simplified since only colored layers of red, green, and blue are disposed without disposing a black matrix. A space between substrates can be further narrowed since an overcoat layer need not be disposed as in the conventional color filter. The quantity of a material with which the space between substrates is filled can be reduced by narrowing the space between the substrates.

In addition, it is preferable to attach the substrate having a light emitting element and a TFT to the sealing substrate under reduced pressure for narrowing the space between the substrates. It makes it difficult for bubbles to be produced therein and easy for the quantity of a material with which the space between the substrates is filled to be adjusted.

When the space between substrates is narrowed to the limit, it may not be favorably filled with a filler if the filler has bad adhesion to the substrate surface. Therefore, it is preferable to entirely or selectively pre-form a base layer for improving the adhesion (or to preprocess a foundation) over a protective film covering a cathode (or an anode) of a light emitting element. Note that the protective film keeps the light emitting element away from moisture.

One feature of the invention described in this specification is a light emitting device including: a pixel portion which has a plurality of white light emitting elements having a first electrode over a first substrate, a layer containing an organic compound adjacent to the first electrode, and a light-transmitting second electrode adjacent to the layer containing an organic compound; and including a second substrate for sealing it. The light emitting device has a bank made of a light shielding material disposed between adjacent first electrodes over the first substrate; colored layers of red, green, and blue provided for the second substrate; a protective film covering the light emitting element; a base layer containing a photocatalytic material disposed over the protective film; and a transparent filler between the colored layers and the base layer containing a photocatalytic material.

In addition, when the light emitting device is a top emission type in the above described structure, the first electrode is made of a light-reflective material film or a lamination of a transparent conductive film and a light-reflective material film. In the above described structure, a light-shielding interlayer insulating film is disposed between the first substrate and the first electrode in order to further enhance contrast.

Note that in order to form a base film, a photocatalytic material (titanium oxide ($TiO_x$), strontium titanate ($SrTiO_3$), cadmium selenide (CdSe), potassium tantalate ($KTaO_3$), cadmium sulfide (CdS), Zirconium oxide ($ZrO_2$), niobium oxide ($Nb_2O_5$), zinc oxide (ZnO), ferric oxide ($Fe_2O_3$), or tungsten oxide ($WO_3$) is dropped into a entire surface by spraying or sputtering, or an organic material (thermosetting polyimide or thermosetting acryl) is selectively formed by an ink-jet method or a sol-gel method as a single layer or a lamination layer.

Since the base film of the present invention using the photocatalytic material has a property of absorbing or scattering sunlight or the like, it functions as a light protective film which protects the light emitting element from sunlight in case that the light emitting device is used under the sun.

A photocatalytic material means a material with a photocatalytic function, and is irradiated with light in an ultraviolet-light region (whose wavelength is 400 nm or less, preferably, 380 nm or less) to be photocatalytically activated.

For example, a photocatalytic material has a lipophilic property but no hydrophilic property before irradiating $TiO_x$ with light, that is, it is in a water-shedding condition. The light irradiation generates the photocatalytic activity, thereby changing the lipophilic condition into the hydrophilic condition. Note that it can have both the hydrophilic property and the lipophilic property simultaneously according to the light irradiation time.

Additionally, the photocatalytic activity can be improved or the photocatalytic activity can be generated with light in a visible-light region (whose wavelength is 400 to 800 nm), by doping the photocatalytic material with transition metal (Pd, Pt, Cr, Ni, V, Mn, Fe, Ce, Mo, W, or the like). A wavelength of light is decided according to the photocatalytic material. Here, the light irradiation means irradiation with light having a wavelength in which a photocatalytic material is photocatalytically activated.

A filler is dropped inside a sealing pattern disposed on a sealing substrate side and the other substrate (a substrate having a photocatalytic material formed on the surface thereof) is attached thereto, thereby filling the narrow space between the substrates with the filler.

Another feature of the invention is a light emitting device including a pixel portion which has a plurality of white light emitting elements having a light-transmitting first electrode over a first substrate; a layer containing an organic compound adjacent to the first electrode; and a light-transmitting second electrode adjacent to the layer containing an organic compound. The light emitting device has a bank made of a light shielding material disposed between the adjacent first electrodes over the first substrate; colored layers of red, green, and blue disposed over the second substrate; a protective film covering the light emitting element; a layer including a material with a photocatalytic function disposed over the protective film; and a transparent filler between the colored layers and the layer including a material with a photocatalytic function.

According to the above described structure, light from the white light emitting element through the first electrode passes through the first substrate; and light from the white light emitting element through the second electrode passes through the colored layers disposed over the second substrate and the second substrate.

According to the above described substrate, the bank made of a light shielding material is disposed with being partially overlapped with the colored layers interposing the transparent filler therebetween. A dimension of the colored layers is larger than that of a light emitting region surrounded with the bank made of a light shielding material. Right and left margins can be taken since a bank which functions as a black matrix is disposed over a substrate having a white light emitting element and a TFT.

In the above described structure, the light emitting device uses an aluminum alloy film including carbon and nickel (Al (C+Ni)) as an electrode or a wiring. An Al (C+Ni) alloy film is a material which has no large variation in the contact resistant value to ITO or ITSO before/after applying current or being heat treated.

An emission layer of a white light emitting element is formed of a charge-injection transporting material and a light emitting material including an organic compound or an inorganic compound. And it includes one layer or multiple layers selected from a low-molecular weight organic compound; a middle-molecular weight organic compound (which is an organic compound having the number of molecules of twenty or less or a length of a molecular chain of 10 μm or less without a sublime property); and a high-molecular weight organic compound, which are classified according to the number of molecules. It may be combined with an inorganic compound with electron injection transportability or hole injection transportability.

An emission layer of a white light emitting element may use a triplet excitation light emitting material including a metal complex or the like besides a singlet excitation light emitting material. One example of the triplet excitation light emitting material is a metal complex used as a dopant; and a metal complex adopting platinum of a third transition series element as a centered metal, a metal complex adopting iridium as a centered metal or the like is known. In addition, as the triplet excitation light emitting material, a compound having the above described substructure and adopting an element belonging to any of Groups 8 to 10 of the periodic table as a centered metal can be used without limiting to the above compounds.

An emission color is decided by a material of an emission layer. Therefore, a light emitting element with a desired emission can be formed by selecting the material. There are polyparaphenylenevinylene-based material, polyparaphenylene-based material, polythiophene-based material, and polyfluorene-based material as a high-molecular weight light emitting material for forming an emission layer.

Such a light emitting element as to emit white light may be formed by disposing an emission layer of two layers or three layers including a blue emission layer in order to obtain white emission. Specifically, the white emission can be obtained by preparing a light emitting element to be a lamination of a mixed-layer first emission layer co-evaporated so that NPB and a phenyl anthracene derivative has a volume ratio of 1:3 and a naphthacenes derivative is included; and a mixed-layer second blue emission layer co-evaporated so that NPB and a phenyl anthracene derivative has a volume ratio of 1:3 and a styryl amine derivative is included, over a hole transport layer.

In another white light emitting element, a lamination of a blue emission layer using an oxazole complex of zinc; a green emission layer using tris(8-quinolinolato)aluminum ($Alq_3$); a red emission layer which is red fluorochrome (P-660, DCM 1)-doped $Alq_3$ may be adopted as an emission layer.

As a white emission layer using two-layer emission, a lamination of a green emission layer which is coumarin6-doped $Alq_3$, and a yellow emission layer which is rubrene-doped TPD may be adopted.

The above-described materials for forming a layer containing an organic compound are just examples. A white light emitting element can be formed by stacking a hole injection transport layer, a hole transport layer, an electron injection transport layer, an electron transport layer, an emission layer, an electron blocking layer, a hole blocking layer or the like. In addition, a mixed-layer thereof or a mixed junction thereof may be formed.

Without limiting to a white light emitting element, a full-color display may be realized by disposing a light-shielding bank over a first substrate as a blue light emitting element, and a color conversion layer over a second substrate instead of a white light emitting element.

It may be possible that a red light emitting element, a blue light emitting element, and a green light emitting element are formed over a first substrate by color-coding each pixel in a layer containing an organic compound; a light-shielding bank is disposed therebetween; and a colored layer for enhancing color purity is disposed over a second substrate. A red luminescent pixel in which the time of reducing luminance by half is comparatively short is formed by a triplet excitation light emitting material, and a green luminescent pixel and a blue luminescent pixel are formed by a singlet excitation light emitting material, for example. The triplet excitation light emitting material has good luminous efficiency, and thus, lower power consumption is used in obtaining the same luminance. In other words, it is adopted for a red pixel to improve the reliability since the amount of electric current passed through a light emitting element is lower. For reducing the power consumption, a red luminescent pixel and a green luminescent pixel may be formed by a triplet excitation light emitting material, and a blue luminescent pixel may be formed by a singlet excitation light emitting material. The power consumption may be further reduced by forming a green light emitting element in which visibility by human is high by a triplet excitation light emitting material.

The invention enables a narrower width of a bank and a space between adjacent light emitting regions. That is, an aperture ratio can be improved.

According to the invention, a display contrast can be improved since a black bank absorbs or shields stray light from a light emitting element. A viewing angle can be made wide by narrowing a space between a substrate having a black bank and a TFT and a sealing substrate having a colored layer.

In addition, the quantity of a filler between a pair of substrates can be reduced if the space between the substrates is narrowed. The space between a pair of substrates can be filled well with the filler by forming a base layer for improving adhesion, even if the space between the substrates is narrowed. The base layer for improving the adhesion enables the fixing intensity between a pair of substrates to be enhanced and reliability of a light emitting device to be improved.

DETAILED DESCRIPTION OF THE INVENTION

An embodiment mode of the invention is described below by using FIGS. 1 to 4.

Figure 1:
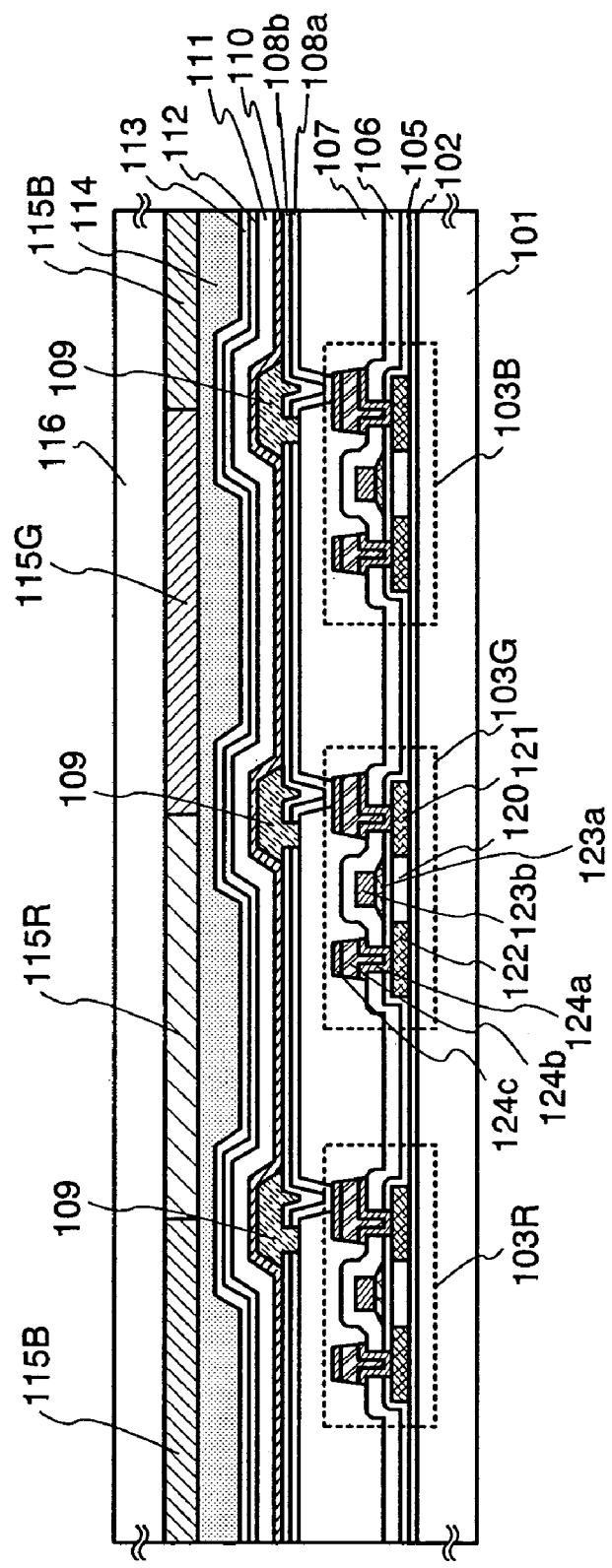
FIG. 1 is a cross sectional view of a light emitting device according to the invention.

FIG. 1 is a cross sectional view partially showing an active-matrix light emitting device.

Three TFTs 103R, 103G, and 103B are disposed over a first substrate 101. The TFTs are p-channel TFTs each having a channel formation region 120 and a source region and a drain region 121 and 122 as active layers; a gate insulating layer 105; and a gate electrode 123a and 123b. The gate electrode is made of two layers having the bottom layer 123a and the top layer 123b to be tapered.

Colored layers 115R for red, 115G for green, and 115B for blue are disposed over a second substrate 116. FIG. 2C is one example showing a top view of the colored layers disposed over the second substrate. Note that the colored layers 115R, 115C, and 115B are disposed facing each light emitting element to color white light emitted from a white light emitting element connected to a TFT.

FIG. 2C shows an example of employing striped colored layers; however, the colored layers may be arranged in matrix. Pixels may be arranged in delta alignment or in mosaic alignment. Four kinds of pixels of red, green, blue and white may be employed on a full-color display by converting three-color image data to four-color image data, without limiting to a full-color display with three kinds of pixels of red, green, and blue. The four kinds of pixels enable luminance to be enhanced, and thus, a vibrant video can be displayed. Note that a color layer facing a pixel of W is not disposed in the case of employing four kinds of pixels.

A bank 109 made of a black resin functions as a black matrix (BM) overlapped with a boundary (or an empty space) between different colored layers. The bank 109 takes a lattice shape so as to surround a light emitting region. If an empty space is formed in the adjacent colored layers, the empty space is required to be narrower than a width of the bank 109.

Figure 2A:
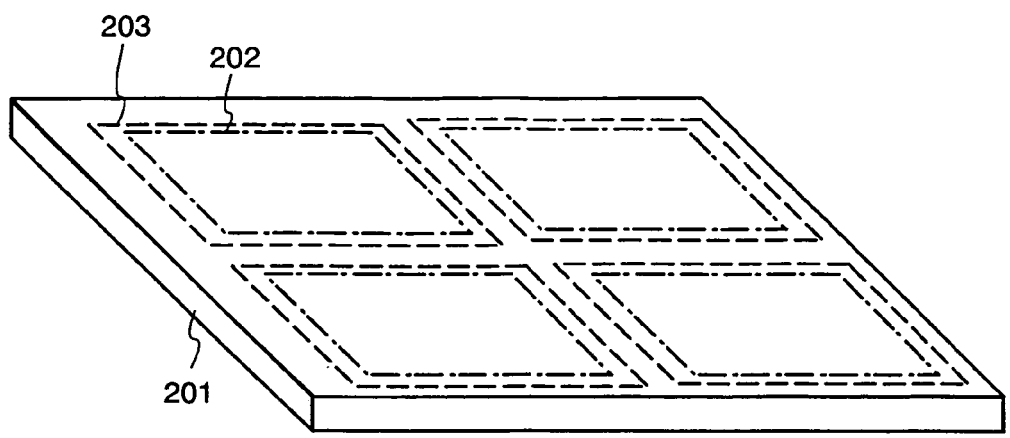
FIGS. 2A to 2D are perspective views of each state where substrates are not attached yet.
Figure 2B:
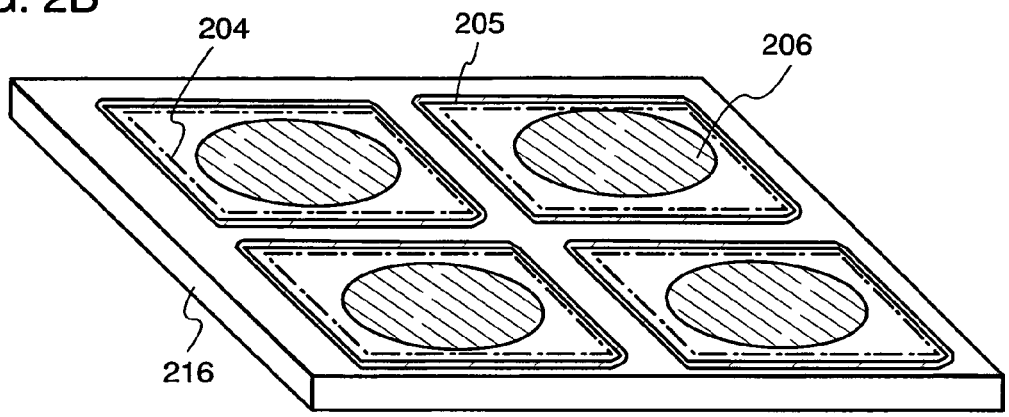
Figure 2C:
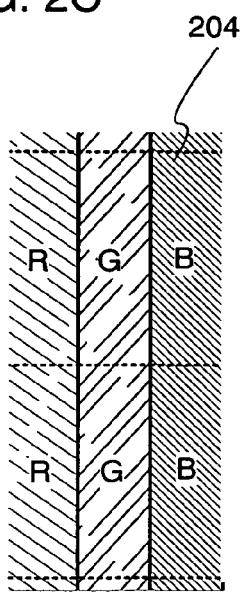
Figure 2D:
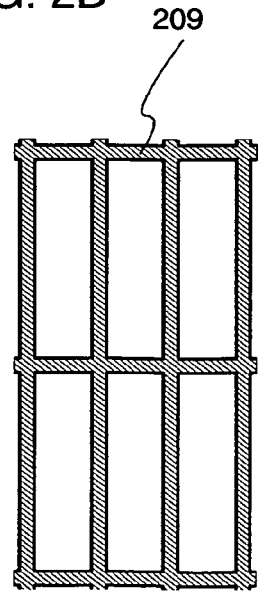

FIG. 2D is one example showing a top view of a bank disposed over a first substrate. A region surrounded with a black bank has the same dimension as a light emitting region. The dimension of a colored layer is made larger than that of a light emitting region to make a viewing angle wide. All light generated in an organic compound layer is not taken from a transparent electrode to a TFT. For example, light is also emitted laterally (in parallel with a substrate face); however, the light emitted laterally is not extracted and, thereby suffering a loss. In addition, the stray light influences an electric property of a TFT since an active layer of a TFT is irradiated with the stray light, and thus it causes deterioration. Consequentially, the invention has a structure in which the bank 109 made of a black resin absorbs or shields stray light from the light emitting element.

A white light emitting element includes a first electrode 108a and 108b, a layer 110 containing an organic compound, and a second electrode 111 made of a transparent conductive material. In FIG. 1, the layer 110 containing organic compound is disposed entirely; however, it may be formed selectively by using one mask because of a white light emitting element.

As for the first electrode 108a and 108b and the second electrode 111, each material thereof is required to be selected in view of a work function. Note that the first electrode and the second electrode can be an anode or a cathode according to a pixel structure. Preferably, the first electrode is made an anode and the second electrode is a cathode, when a driving TFT is a p-channel type. Preferably, a first electrode is made a cathode and a second electrode is made an anode, when a driving TFT is an n-channel type.

As one example, the first electrode is formed by stacking the bottom layer 108a made of a metal material (Ag (silver), Au (gold), Cu (copper), W (tungsten), Al (aluminum), or the like) and the top layer 108b made of a transparent conductive material (indium tin oxide (ITO), indium tin oxide including silicon oxide (ITSO), zinc oxide (ZnO), tin oxide ($SnO_2$), or the like). A top-emission type light emitting device in which emitted light passes through a second substrate is obtained in the case of employing a reflective layer as the bottom layer 108a; and a dual-emission type light emitting device in which emitted light passes first and second substrates is obtained in the case of employing a light-transmitting layer as the bottom layer 108a. Note that in the case of using a top emission type, stray light between material layers with different reflective indexes can be controlled, since a material layer in which light emitted from a layer containing an organic compound passes can be reduced as compared with a bottom emission type.

It is the most preferable to use an Al (C+Ni) alloy film for the bottom layer 108a, and simultaneously, use indium tin oxide including silicon oxide (ITSO) for the top layer 108b. In this embodiment, an Al (C+Ni) alloy film in which Al includes C of 0.3 atoms % and Ni of 3 atoms % is adopted. An Al (C+Ni) alloy film is a material which has no large variation in the contact resistant value to ITO or ITSO before/after applying current or being heat treated. ITSO is difficult to be crystallized by applying current or being heat treated and it is a material whose surface is flat with a high accuracy.

The layer 110 containing an organic compound is formed by stacking a HIL (a hole injection layer), a HTL (a hole transport layer), an EML (an emission layer), an ETL (an electron transport layer), and an EIL (an electron injection layer) sequentially from a first electrode (an anode) side. Note that a layer containing an organic compound can have a single layer structure or a mixed structure, as well as a laminated structure.

It is preferable to dispose a protective film 112 covering a second electrode 111 in order to protect a light emitting element from damage caused by moisture or a degas. It is desirable to use a dense inorganic insulating film (a SiN film, a SiNO film, or the like) by a PCVD method, a dense inorganic insulating film (a SiN film, a SiNO film, or the like) by a sputtering method, a carbon-based thin film (a DLC film, a CN film, an amorphous carbon film), a metal oxide film ($WO_2$, $CaF_2$, $Al_2O_3$ or the like), or the like for the protective film 112. A diamond like carbon film (also referred to as a DLC film) can be formed by a plasma CVD method (typically, an RF plasma CVD method, a microwave CVD method, an electron cyclotron resonance (ECR) CVD method, a hot-filament CVD method), a combustion flame method, a sputtering method, an ion-beam vapor deposition, a laser vapor deposition, or the like. A hydrogen gas and a hydrocarbon system gas (for example, $CH_4$, $C_2H_2$, $C_6H_6$, or the like) are used as a reactive gas for film formation. The gas is ionized by glow discharge and an accelerated ion collides with a cathode which suffers negative self-bias, thereby forming a film. A CN film may be formed by using a $C_2H_4$ gas and an $N_2$ gas as a reactive gas. Note that a DLC film or a CN film is a transparent or semitransparent insulating layer to visible light, although depending on a film thickness. It is transparent to visible light when the transmittance of visible light is 80 to 100%; and it is semitransparent to visible light when the transmittance of visible light is 50 to 80%.

A base layer 113 (also referred to as a buffer layer) containing a photocatalytic material is disposed over the protective film 112. There are titanium oxide ($TiO_x$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), ferric oxide ($Fe_2O_3$), and tungsten oxide ($WO_3$), obtained by a sputtering method or a spray method, as a material with a photocatalytic function. The base layer 113 preferably has a light-transmitting property. Note that the base layer 113 also functions as a protective film.

A space between the first substrate 101 and the second substrate (or the opposite substrate) 116 is filled with a filler 114. The base layer 113 containing a photocatalytic material is disposed in order to improve the adhesion between the filler and a sealing member for sealing a first substrate and a second substrate or the adhesion between the protective film and the filler 114. Note that the base layer 113 is in advance irradiated with light of a wavelength to activate photocatalysis before attaching the substrates to each other. A layer including a material with a photocatalytic function may be disposed as an overcoat layer for covering a colored layer on the second substrate 116 side.

An example of disposing a colored layer on a side close to the first substrate 101 over the second substrate 116 is described. However, a colored layer may be disposed on the outer side of the second substrate 116, and then, a structure in which the second structure 116 and the filler 114 are contacted to each other is used.

FIGS. 2A and 2B are perspective views of each substrate before being attached to each other. Here, four panels are taken from one substrate. A pixel portion 202 including a BM 209 and a white light emitting element; and a photocatalytic material formation region 203 so as to cover the pixel 202 are disposed over a first substrate 201 shown in FIG. 2A. Note that a part of the BM 209 is shown in FIG. 2D. A seal 205 is disposed so as to surround a colored layer 204 to be overlapped with a pixel portion over a second substrate 216 shown in FIG. 2B. A filler 206 is dropped into a region surrounded with the seal 205 by a droplet discharging method. Note that a part of the colored layer 204 is shown in FIG. 2C.

The first substrate is attached to the second substrate to prevent bubbles from being produced, so that the photocatalytic material formation region 203 is in contact with the filler 206 and the seal 205 with a lamination device.

Figure 3A:
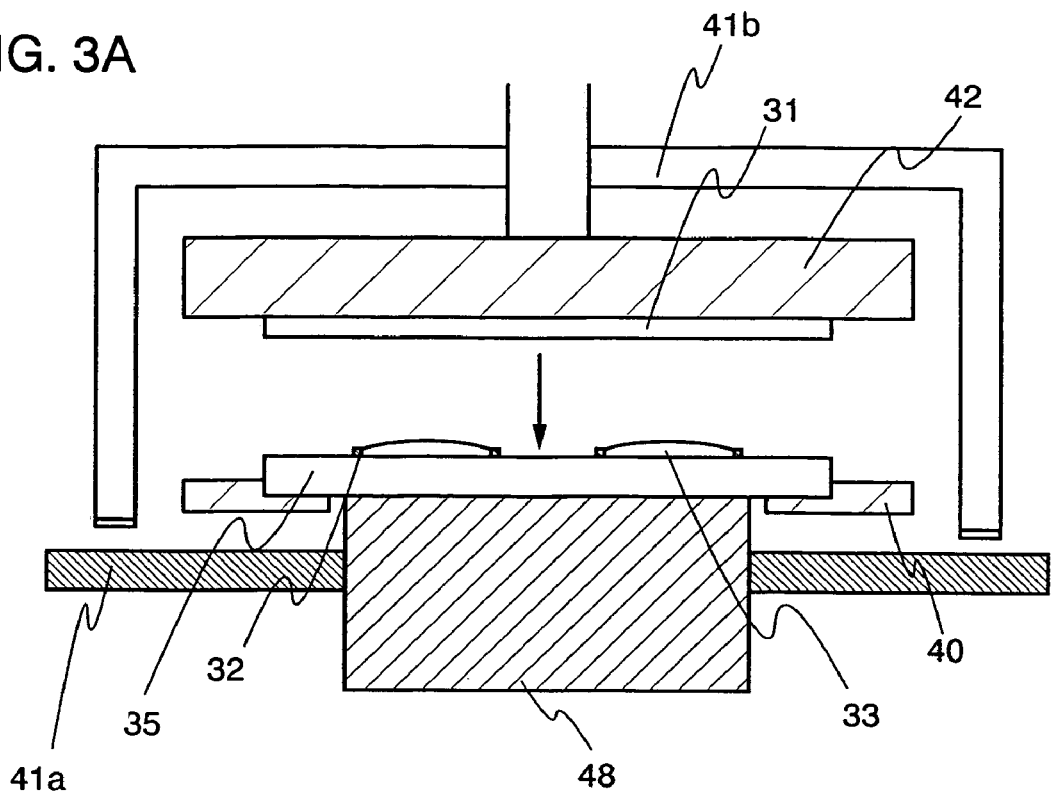
FIGS. 3A and 3B are cross sectional views of each lamination device.
Figure 3B:
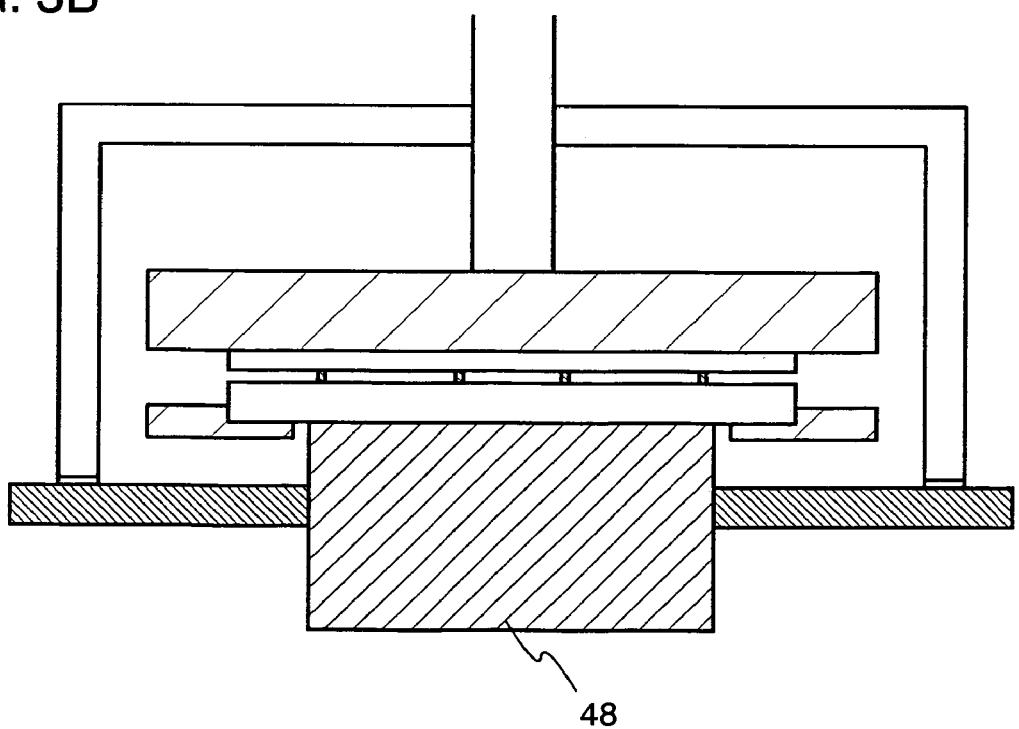

FIGS. 3A and 3B show an example of a lamination device. The substrates can be attached to each other under a reduced-pressure atmosphere with the lamination device shown in FIGS. 3A and 3B.

In FIGS. 3A and 3B, reference number 40 is a first substrate holder; reference number 41b is an upper part of a vacuum chamber; reference number 41a is a lower part of the vacuum chamber; reference number 42 is a second substrate holder; and reference number 48 is a lower plate. A state where the substrates are not attached yet is shown in FIG. 3A.

An attaching method is described below. The pressure inside of a chamber is decreased after lowering the upper part of the vacuum chamber 41b so as to be in contact with the lower part of the vacuum chamber 41a. The second substrate holder 42 facing the first substrate holder 40 is lowered. Then, a first substrate 35 is attached to a second substrate 31 by being pressurized, and heating thereto makes them hardened. The second substrate holder 42 and the lower plate 48 each have a heater therein to harden a sealing member 32 and a filler 33. A state where the substrates have been attached is shown in FIG. 3B. In addition, a sealing member may be drawn under a reduced-pressure atmosphere.

Figure 4:
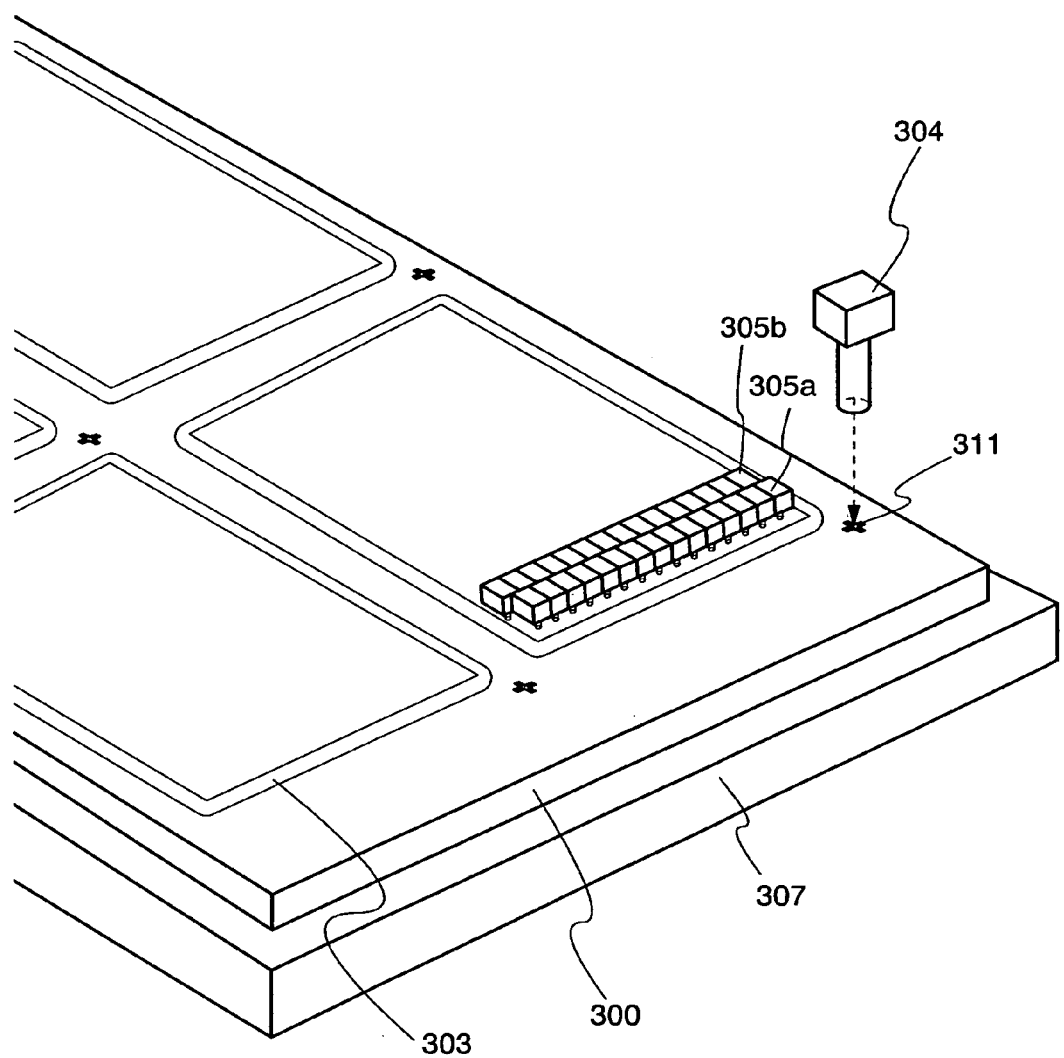
FIG. 4 is a perspective view in dropping a filler.

An example of a droplet discharging method is shown in FIG. 4. In FIG. 4, reference number 300 is a second substrate; reference number 304 is an imaging unit; reference number 307 is a stage; reference number 311 is a marker; and reference number 303 is a seal surrounding a pixel. Heads 305a and 305b having the same width as a pixel portion are scanned by moving the stage, for instance in a zigzag or back and forth, to drop the filler suitably. The width of the head may be equal to that of a substrate. However, the operation is easier when the width of the head is equal to a panel size as shown in FIG. 4. In addition, it is preferable to drop the filler while moving the stage for improving the throughput.

The attached substrates may be cut to a desirable size.

A single layer or a lamination of an inorganic insulating film (a SiN film, a SiNO film, or the like) by a PCVD method is adopted as a base insulating film 102 to be formed over the first substrate 101. An interlayer insulating film 106 is formed by using an inorganic insulating film (a SiN film, a SiNO film, or the like) by a PCVD method.

A high-thermostable planarization film 107 to be disposed over the interlayer insulating film 106 is a flat interlayer insulating film by a coating method using liquid. The flat interlayer insulating film by a coating method using liquid is formed by being coated with a liquid compound. As the flat interlayer insulating film by a coating method using liquid, there are an organic resin such as acryl or polyimide; a coated silicon oxide film (Spin on Glass, also referred to as SOG), that are a film formed by heat treatment after being coated with an interlayer insulating material been soluble in organic solvent; a material to form a siloxane bond by baking a siloxane polymer and the like. The high-thermostable planarization film 107 can adopt an inorganic insulating film such as a silicon oxide film formed by vapor phase growth or a sputtering method, without limiting to a coating method using liquid. In addition, a flat insulating film may be stacked by a coating method using liquid after a silicon nitride film is formed by a PCVD method or a sputtering method as a protective film.

It is important to make the first electrode flat in a white light emitting element. There is a possibility that a first electrode may not be made flat when the high-thermostable planarization film 107 is not flat and the surface thereof has depressions. Therefore, the planarity of the high-thermostable planarization film 107 is important.

A drain wiring or a source wiring 124a, 124b, and 124c of a TFT has a three-layer structure. Here, a laminated film of a Ti film, Al (C+Ni) alloy film and a Ti film is employed. A drain wiring or a source wiring of a TFT is preferably made to be tapered, in consideration of the coverage of an interlayer insulating film.

As an example, a top-gate type TFT is described; however, the invention can be applied regardless of a TFT structure, and can be applied to a bottom-gate type (inversely staggered) TFT or a sequentially staggered TFT.

The invention with the above structures is described further in detail with the following embodiments.

Embodiment 1

Figure 5A:
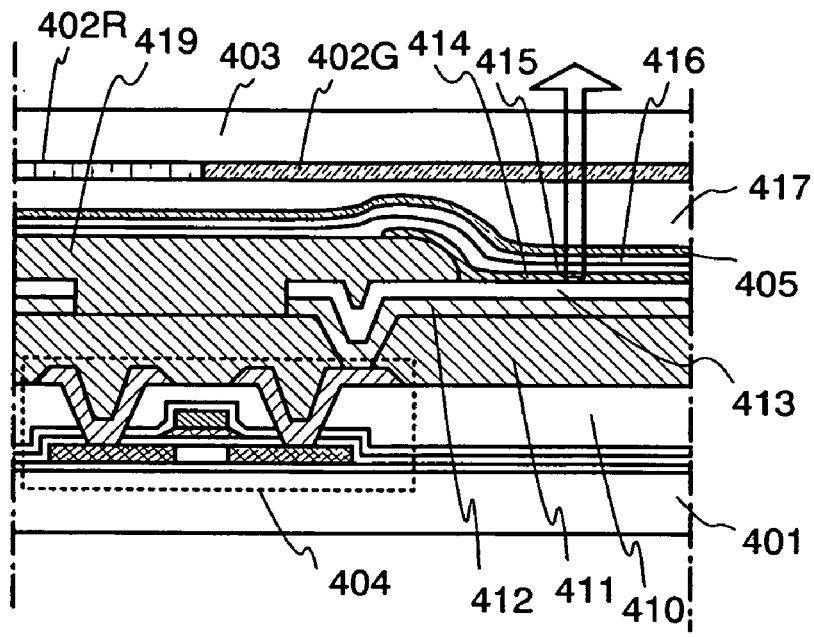
FIGS. 5A and 5B are cross-sectional views of each light emitting device (Embodiment 1, Embodiment 2)

This embodiment describes an embodiment of manufacturing a top-emission type light emitting device with reference to FIG. 5A First, a base insulating film is formed over a first substrate 401. Any substrate with planarity and thermostability may be adopted as the first substrate 401, without being particularly limited. As the base insulating film, a base film made of an insulating film such as a silicon oxide film, a silicon nitride film, or a silicon oxynitride film is formed.

Next, a semiconductor film is formed over the base insulating film. A semiconductor layer is formed as described below. A semiconductor film having an amorphous structure is formed by a known method (a sputtering method, a LPCVD method, a plasma CVD method, or the like). Thereafter, a known crystallization processing (a laser crystallization method, a thermal crystallization method, a thermal crystallization method with a catalyst such as nickel, or the like) is performed, thereby obtaining a crystalline semiconductor film to be patterned with a first photo mask to have a desirable shape. A thickness of the semiconductor layer is made 25 to 80 nm (preferably, 30 to 70 nm). A material of a crystalline semiconductor film is not limited particularly; however, silicon, silicon germanium (SiGe) alloy, or the like may be used.

In addition, a continuous-wave laser may be used for a crystallization processing of a semiconductor film having an amorphous structure. It is preferable to apply a second harmonic wave to a fourth harmonic wave of a fundamental wave with a solid state laser capable of a continuous wave to obtain a large grain-diameter crystal in crystallization of an amorphous semiconductor film. Typically, a second harmonic wave (532 nm) or a third harmonic wave (355 nm) of Nd:YVO$_4$ laser (a fundamental wave 1064 nm) may be applied. In the case of using a continuous-wave laser, laser light emitted from a continuous-wave YVO$_4$ laser with 10 W output is converted to a harmonic wave by a nonlinear optical element. In addition, a harmonic wave can be also emitted by putting a YVO$_4$ crystal and a nonlinear optical element into a resonator. A subject is preferably irradiated with laser light formed into a rectangular or elliptical shape on an irradiation face by an optical system. At this time, the energy density is desired to be approximately 0.01 to 100 MW/cm$^2$ (preferably, 0.1 to 10 MW/cm$^2$). A semiconductor film is moved relatively to laser light at the rate of approximately 10 to 2000 cm/s for irradiation.

A gate insulating film for covering a semiconductor layer is formed after removing the resist mask. A gate insulating film is formed to be 1 to 200 nm in thickness by a plasma CVD method, a sputtering method, or a thermal oxidation method.

A conductive film is formed to be 100 to 600 nm in film thickness over a gate insulating film. The conductive film comprising a lamination of a TaN film and a W film is formed by a sputtering method. The conductive film may be formed of a single layer or a lamination made from an element selected among Ta, W, Ti, Mo, Al, or Cu, or an alloy material or a compound material containing the foregoing elements as its main components, without limiting to the lamination of a TaN film or a W film. In addition, a semiconductor film as typified by a polycrystalline silicon film doped with an impurity element such as phosphorus may be used.

A resist mask is formed by using a second photo mask, and etching is conducted by a dry-etching method or a wet-etching method. The conductive film is etched by this etching step to form a gate electrode of a TFT 404.

Next, after removing the resist mask, a resist mask is newly formed by using a third photo mask. A first doping step is conducted to dope a semiconductor with an impurity element (typically, phosphorus or As) for giving an n type in low concentration, thereby forming an n-channel TFT not shown in the figure. The resist mask covers a region to be a p-channel TFT and the neighborhood of the conductive layer. Through doping is conducted through the insulating film by the first doping step to form an n-type lightly doped impurity region. One light emitting element is driven by using a plurality of TFTs; however, in the case of being driven by using only a p-channel TFT, the above described doping step is not required.

Next, after removing the resist mask, a resist mask is newly formed by using a fourth photo mask. A second doping step is conducted for doping an impurity element (typically, boron) to give a p-type a semiconductor in high concentration. Through doping is conducted through the gate insulating film by the second doping step to form a p-type heavily doped impurity region.

A resist mask is newly formed by using a fifth photo mask. A third doping step is conducted for doping an impurity element (typically, phosphorus or As) to give an n type a semiconductor in high concentration, thereby forming an n-channel TFT not shown in the figure. The resist mask covers a region to be a p-channel TFT and the neighborhood of the conductive layer. Through doping is conducted through the gate insulating film by the third doping step to form an n-type heavily doped impurity region.

Then, the resist mask is removed and an insulating film including hydrogen is formed. Thereafter, the impurity element added to the semiconductor layer is activated and hydrogenated. A silicon oxynitride film (a SiNO film) obtained by a PCVD method is employed for the insulating film including hydrogen.

A planarization film 410 to be a second layer of an interlayer insulating film is formed. As the planarization film 410, an inorganic material (silicon oxide, silicon nitride, silicon oxynitride, or the like); a photosensitive or non-photosensitive organic material (polyimide, acryl, polyamide, polyimide amide, resist, or benzocyclobutene); a lamination thereof; or the like is employed. As another film to be adopted for a planarization film, an insulating film made of a SiOx film including an alkyl group, which is obtained by a coating method using liquid; for example, an insulating film made of silica glass, alkyl siloxane polymer, alkyl silsesquioxane polymer, hydrogenated silsesquioxane polymer, hydrogenated alkyl silsesquioxane polymer, or the like. As an example of siloxane system polymer, there is PSB-K1 or PSB-K31 which is a coating insulating film material produced by Toray; or ZRS-5PH which is a coating insulating film material produced by Catalysts & Chemicals Co., Ltd.

A contact hole is formed in the interlayer insulating film by using a sixth mask. Next, the sixth mask is removed. Then, a conductive film (a sequential lamination of a TiN film, an Al(C+Ni) alloy film, and a TiN film) is formed, and etching is conducted by using a seventh mask to form a wiring (a source wiring and a drain wiring of a TFT, a current-supply wiring, or the like).

Next, after removing the seventh mask, an interlayer insulating film 411 which is a third layer is formed. A photosensitive or non-photosensitive organic material prepared by scattering a black pigment obtained by a coating method using liquid is employed for the third interlayer insulating film 411. In this embodiment, a light-shielding interlayer insulating film is employed in order to improve contrast and absorbing stray light. In addition, a silicon oxynitride film (a SiNO film) obtained by a PCVD method may be stacked as a fourth interlayer insulating film for protecting the third interlayer insulating film. In the case of disposing the fourth interlayer insulating film, it is desired to be selectively removed after patterning a first electrode as a mask in a later step.

A contact hole is formed in the interlayer insulating film by using an eighth mask.

A reflective conductive film and a transparent conductive film are formed. Thereafter, a lamination of a reflective electrode 412 and a transparent electrode 413 is obtained by patterning with a ninth mask. Ag, Al, or an Al (C+Ni) alloy film is employed for the reflective electrode 412. Indium tin oxide (ITO) is employed for the transparent electrode 413; and as another example thereof, there is a transparent conductive material such as indium tin oxide containing Si (ITSO) or indium zinc oxide (IZO) prepared by mixing 2 to 20% of zinc oxide (ZnO) into indium oxide.

A light-shielding insulator 419 serving as a bank, that is a black matrix (BM), is formed so as to cover each edge of the reflective electrode 412 and the transparent electrode 413 by using a tenth mask. As the light-shielding insulator, an photosensitive or non-photosensitive organic material (polyimide, acryl, polyamide, polyimide amide, a resist, or benzocyclobutene) prepared by scattering a black pigment or a SOG film (for example, a SiOx film including an alkyl group) is used in the range of 0.8 to 1 μm in film thickness. A material like COLOR MOSAIC CK (trade name) produced by Fuji Film Olin Corp. is used. In this embodiment, the interlayer insulating film 411 is formed by a light-shielding insulator, so that the thickness of the insulator 419 can be made thinner or a low-light shielding material can be employed.

A layer 414 containing an organic compound is formed by a vapor deposition or a coating method using liquid. There are many methods for obtaining white emission. In this embodiment, a case of using an emission layer made of a high-molecular weight material which can be formed by a coating method using liquid is described. In this case, an emission layer can be dye-doped with a high-molecular weight material by solution adjustment. The dye-doping is easier to be conducted than a vapor deposition method for carrying out co-evaporation by using a plurality of dyes. Specifically, over an anode, poly (ethylenedioxy thiophene)/poly (styrenesulfonic acid) aqueous solution (PEDOT/PSS) which functions as a hole injection layer is coated over the entire face and baked. Thereafter, a polyvinylcarbazole (PVK) solution doped with a luminescent center dye (1,1,4,4-tetraphenyl-1, 3-butadiene (TPB), 4-dicyanomethylene-2-carbinyl-6-(p-dimethylamino-styryl)-4H-pyran (DCM 1), Nile red, Coumarin6, or the like) which functions as an emission layer is coated over the entire face and baked. Note that water is used as solvent of PEDOT/PSS, and it is insoluble in organic solvent. Therefore, PEDOT/PSS is not melted even if PVK is coated thereon. In addition, it is preferable to use different film formation chambers since solvent of PEDOT/PSS differs from that of PVK.

This embodiment shows an example of stacking an organic compound film made of a high-molecular weight material; however, a single layer containing an organic compound may be used. For instance, 1,3,4-oxadiazole derivative (PBD) with electron transportability may be scattered in polyvinylcarbazole (PVK) with hole transportability. In addition, PBD of 30 wt % is scattered as an electron transport agent and a suitable amount of four kinds of dye (TPB, coumarin6, DCM 1, nailered) is scattered, thereby obtaining white light-emitting. An organic compound film emitting red light, an organic compound film emitting green light, and an organic compound film emitting blue light are suitably selected and mixed to each other, thereby enabling white emission to be obtained.

A deaeration is preferably conducted by vacuum heating before forming the layer 414 containing an organic compound in order to improve reliability of a light emitting element. For instance, it is preferable to perform heat treatment in 200 to 300° C. under reduced-pressure atmosphere or inert atmosphere in order to remove gas included in a substrate, before depositing an organic compound material.

A transparent electrode 415, that is, a cathode of an organic light emitting element, is formed in the range of 10 to 800 nm in film thickness over the layer 414 containing an organic compound. Indium tin oxide (ITO) is employed for the transparent electrode 415; and as another example thereof, there is indium tin oxide containing Si (ITSO) or indium zinc oxide (IZO) prepared by mixing 2 to 20% of zinc oxide (ZnO) into indium oxide.

A white light emitting element is formed as described above. Each material of an anode, a layer containing an organic compound, and a cathode constructing a white light emitting element is suitably selected, and each film thickness thereof is adjusted. The same material is used in an anode and a cathode, and the same film thickness thereof is desired to be made, preferably, approximately 100 nm to be a thin film thickness.

A transparent protective film 416 is formed to prevent moisture from intruding by covering a light emitting element. A silicon nitride film, a silicon oxide film, a silicon oxynitride film (a SiNO film (composition ratio N>O) or a SiON film (composition ratio N<O)), a thin film containing carbon as its main component (for example, a DLC film, a CN film) or the like, obtained by a sputtering method or a CVD method can be used as the transparent protective film 416.

A base layer 405 containing a photocatalytic material is formed in order to improve the wettability. A $TiO_2$ crystal having a predetermined crystal structure is formed as a photocatalytic material by a sputtering method. A metal titanium tube is used as a target and sputtering is performed by using an argon gas and oxygen. Further, a He gas may be introduced. Oxygen-rich atmosphere is made and formation pressure is increased in order to form $TiO_2$ with high photocatalytic activity. In addition, $TiO_2$ is preferably formed while heating a film formation chamber or a substrate having a processed product. $TiO_2$ formed as described above is an exceeding thin film (approximately 1 μm) and has a photocatalytic function. Thereafter, light is condensed by using an optical system because an irradiation region is formed by selective light irradiation. $TiO_2$ in an irradiation region has a hydrophilic property. Note that $TiO_2$ may have both the hydrophilic property and a lipophilic property simultaneously according to the light irradiation time.

A second substrate 403 having colored layers 402G, and 402R is attached to the substrate 401 by using a sealing member including a gap member (such as a filler (a fiber rod) or a particle (a spherical-shaped silica atomy or the like)) for keeping a space between substrates. A space between a pair of substrates is filled with a filler 417, typically, an ultraviolet curing or a thermosetting epoxy resin. A glass substrate, a quartz substrate, or a plastic substrate with the light transparency may be used for the second substrate 403. The entire transmission can be much more increased by filling the space between a pair of substrates with a transparent filler (flexibility is approximately 1.50), compared to the case of being vacant between a pair of substrates (an inert gas).

As for a light emitting element of this embodiment, the transparent electrode 415, the transparent protective layer 416, the base layer 405 containing a photocatalytic material, and the filler 417 are each formed by a light-transmitting material, and letting in light from a top surface side is possible as shown by an outline arrow in FIG. 5A.

In addition, this embodiment can be freely combined with Embodiment Mode.

Embodiment 2

Figure 5B:
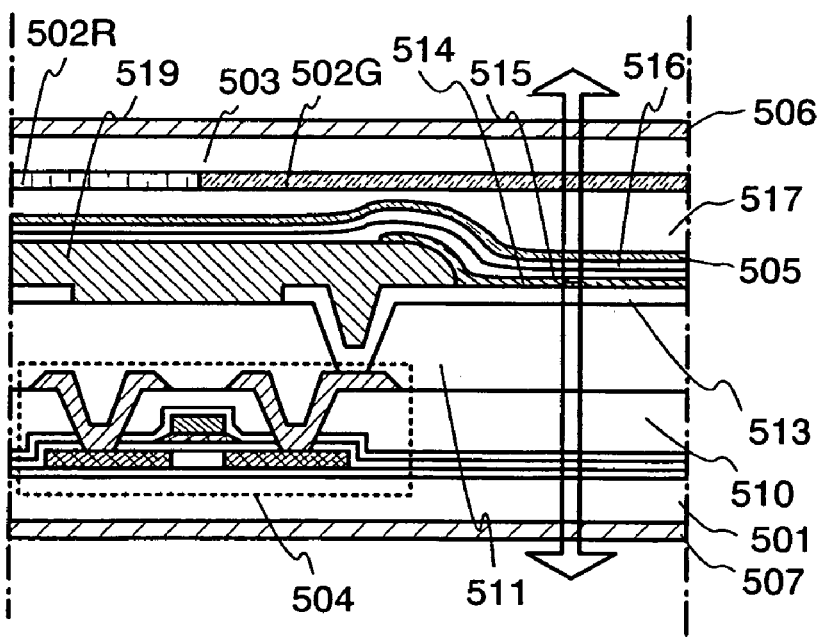

An example of manufacturing a dual-emission type light emitting device is described in this embodiment with reference to FIG. 5B.

First, a base insulating film is formed over a light-transmitting first substrate 501. Any substrate with a light-transmitting property may be adopted as the first substrate 501. As a base insulating film, a base film made of an insulating film such as a silicon oxide film, a silicon nitride film, or a silicon oxynitride film is formed.

A semiconductor layer is formed over the base insulating film as in Embodiment 1. A gate insulating film for covering the semiconductor layer is formed and a gate electrode is formed thereon as in Embodiment 1.

An n-type lightly doped impurity region, a p-type heavily doped impurity region, an n-type heavily doped impurity region, or the like is formed by doping as in Embodiment 1. Then, a resist mask is removed and an insulating film including hydrogen (a light-transmitting interlayer insulating film) is formed. Thereafter, an impurity element with which the semiconductor layer is doped is activated and hydrogenated.

A light-transmitting planarization film 510 to be a second layer of the interlayer insulating film is formed. As the light-transmitting planarization film 510, an inorganic material (silicon oxide, silicon nitride, silicon oxynitride, or the like); a photosensitive or non-photosensitive organic material (polyimide, acryl, polyamide, polyimide amide, a resist, or benzocyclobutene); a lamination thereof; or the like is employed.

A contact hole is formed in the interlayer insulating film as in Embodiment 1. Then, a conductive film (a sequential lamination of a TiN film, an Al(C+Ni) alloy film, and a TiN film) is formed as in Embodiment 1; thereafter, etching is selectively conducted to form a wiring (a source wiring and a drain wiring of a TFT 504, a current-supply wiring, or the like).

A third interlayer insulating film 511 is formed. An insulating film made of a SiOx film including an alkyl group, which is obtained by a coating method using liquid is adopted as the third interlayer insulating film 511. In addition, a silicon oxynitride film (a SiNO film) obtained by a PCVD method may be stacked as a fourth interlayer insulating film in order to protect the third interlayer insulating film. In the case of disposing the fourth interlayer insulating film, it is desired to be selectively removed after patterning a first electrode as a mask in a later step.

Next, a contact hole is formed in the interlayer insulating film.

A transparent electrode 513 is obtained by patterning after forming a transplant conductive film. Indium tin oxide (ITO) is employed for the transparent electrode 513; and as another example thereof, there is a transparent conductive material whose work function is high, such as indium tin oxide containing Si (ITSO) or indium zinc oxide (IZO) prepared by mixing 2 to 20% of zinc oxide (ZnO) into indium oxide.

A light-shielding insulator 519 to be a black matrix (BM) is formed so as to cover an edge of the transparent electrode 513 by using a mask. As the light-shielding insulator, an photosensitive or non-photosensitive organic material (polyimide, acryl, polyamide, polyimide amide, a resist, or benzocyclobutene) prepared by scattering a black pigment or a SOG film (for example, a SiOx film including an alkyl group) is used in the range of 0.8 to 1 μm in film thickness.

A layer 514 containing an organic compound is formed by a vapor deposition or a coating method using liquid as in Embodiment 1.

A transparent electrode 515, that is, a cathode of an organic light emitting element, is formed in the range of 10 to 800 nm in film thickness over the layer 514 containing an organic compound. Indium tin oxide (ITO) is employed for the transparent electrode 515; and as another example thereof, there is indium tin oxide containing Si (ITSO) or indium zinc oxide (IZO) prepared by mixing 2 to 20% of zinc oxide (ZnO) into indium oxide.

As describe above, a white light emitting element is formed.

A transparent protective film 516 is formed to prevent moisture from introducing by covering a light emitting element as in Embodiment 1. A silicon nitride film, a silicon oxide film, a silicon oxynitride film (a SiNO film (composition ratio N>O) or a SiON film (composition ratio N<O)), a thin film containing carbon as its main component (for example, a DLC film, a CN film), or the like, obtained by a sputtering method or a CVD method can be used as the transparent protective film 516.

A base layer 505 containing a photocatalytic material is formed in order to improve the wettability as in Embodiment 1.

A second substrate 503 having colored layers 502G, and 502R is attached to the substrate 501 by using a sealing member including a gap member (such as a filler (a fiber rod) or a particle (a spherical-shaped silica atomy or the like)) for keeping a space between substrates. A space between a pair of substrates is filled with a filler 517, typically, an ultraviolet curing or heat curing epoxy resin. A glass substrate, a quartz substrate or a plastic substrate with the light transparency may be used for the second substrate 503.

As for a light emitting element of this embodiment, the transparent electrode 515 and the filler 517 are each formed by using a light-emitting material, and letting in light from a top surface side and a bottom surface side is possible as shown by an outline arrow in FIG. 5B.

Lately, optical films (a polarizing plate or a circularly polarizing plate) 506 and 507 are formed to improve a contrast.

For instance, the optical film 507 (a λ/4 plate and a polarizing plate are arranged from the substrate 501 side) is disposed over the substrate 501; and the optical film 506 (a λ/4 plate and a polarizing plate are arranged from the substrate 503 side) is disposed over the second substrate 503.

As another instance, the optical film 507 (a λ/4 plate, a λ/2 plate and a polarizing plate are arranged from the substrate 501 side) is disposed over the substrate 501; and the optical film 506 (a λ/4 plate, a λ/2 plate and a polarizing plate are arranged from the substrate 503 side) is disposed over the second substrate 503.

In the invention, a polarizing plate, a circularly polarizing plate, or a combination thereof can be disposed according to a structure of a dual-emission type display device. Therefore, a clear black display can be performed and a contrast is improved. Further, a circularly polarizing plate can prevent reflective light.

In addition, this embodiment can be freely combined with Embodiment Mode and Embodiment 1.

Embodiment 3

Figure 6:
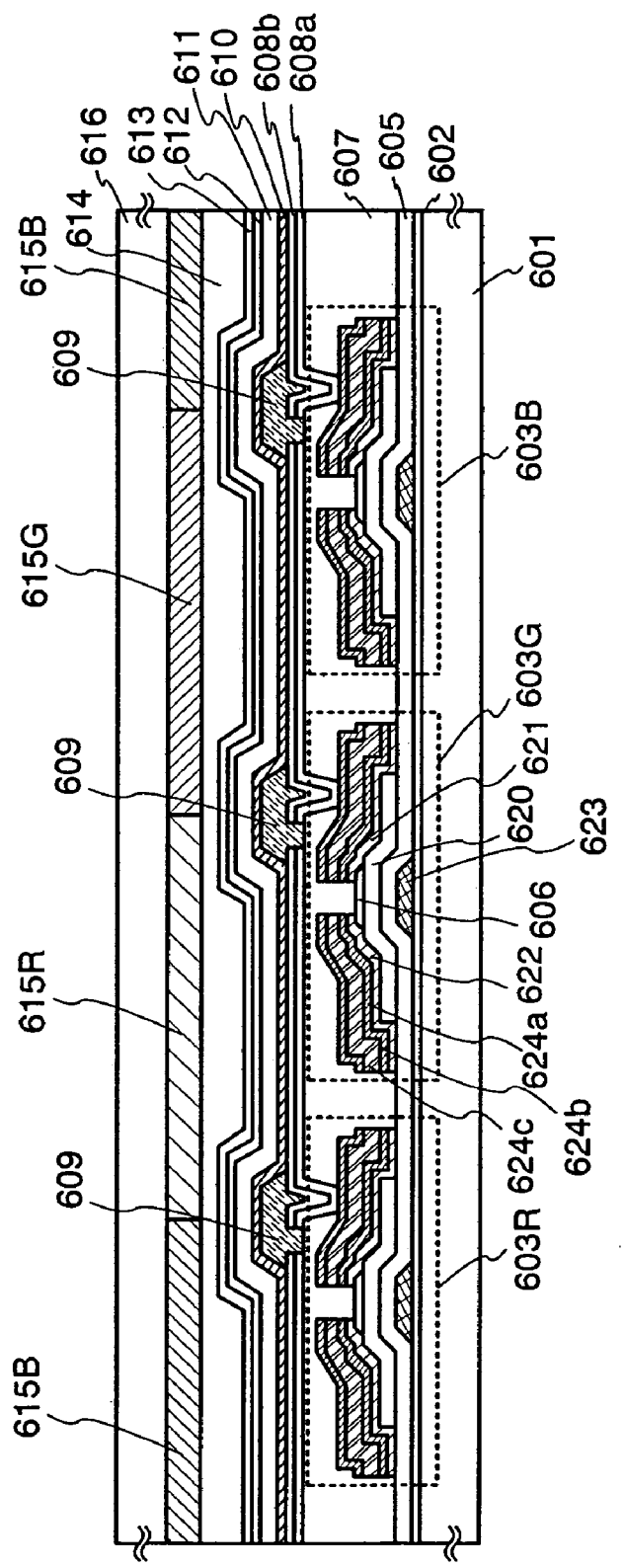
FIG. 6 is a cross-sectional view showing Embodiment 3.

An example of manufacturing a light emitting device using a bottom gate type (inversely staggered) TFT is described in this embodiment with reference to FIG. 6.

First, a base insulating film 602 is formed over a substrate 601. It is preferable to use an insulating film such as a silicon oxide film, a silicon nitride film, or a silicon oxynitride film ($SiO_xN_y$) as the base insulating film 602. Note that the substrate 601 can adopt a plastic substrate with the thermostability that can withstand a processing temperature in this manufacturing process, or the like, besides a non-alkaline glass substrate.

A conductive film of 100 to 600 nm in a film thickness is formed over the base insulating film 602. An element which is selected from Tantalum (Ta), titanium (Ti), molybdenum (Mo), tungsten (W), chromium (Cr), silicon (Si), scandium (Sc), Nd, Al, or Cu, or an alloy film in which the elements are combined (typically, a Mo—W alloy and a Mo—Ta alloy) can be used for a conductive film.

A resist mask is formed using a photo mask and etching is conducted by a dry-etching method or a wet-etching method. A conductive layer 623 is obtained by etching the conductive film in this etching process. Note that the conductive layer 623 becomes to serve as a gate electrode of a TFT 603R, 603G, or 603B. An edge of the conductive layer is preferably made to be tapered by etching it so as not to generate a coverage defect, in order to form a thin semiconductor film in a later step.

An insulating film 605 for covering the conductive layer is formed after removing the resist mask. The insulating film 605 is made in a film thickness of 50 to 200 nm by using a single-layer or lamination film of an insulating film such as a silicon oxide film, a silicon nitride film, or a silicon oxynitride film ($SiO_xN_y$), which is obtained by a plasma CVD method or a sputtering method. For example, a laminated structure may be adopted by using a silicone nitride film as a bottom layer and a silicon oxide film as a top layer. Note that the insulating film 605 becomes a gate insulating film of a TFT. In addition, another insulating film such as a tantalum oxide film may be used for a gate insulating film without limiting to the above described material. However, the conductive layer 623 is made not to be damaged by a film-formation temperature of the conductive layer 605.

A semiconductor film having an amorphous structure or a semiconductor film having a crystal structure is formed in a film thickness of 50 to 200 nm (preferably, 100 to 150 nm) over an entire face of the insulating film by a plasma CVD method. In this embodiment, a semi-amorphous silicon film is formed by using a $SiH_4$ gas and a $F_2$ gas for a material gas. In addition, a semi-amorphous silicon film to be obtained by a PCVD method with a mixture gas of a $SiH_4$ gas and a $F_2$ gas may be irradiated with a laser light to further improve the crystallinity.

A PCVD method may be adopted as another film formation method of a semi-amorphous semiconductor film by using a mixture gas in which $SiH_4$ is diluted with $H_2$ to be triple to thousand-fold, a mixture gas in which $Si_2H_6$ is diluted with $GeF_4$ in a gas flow ratio of 20 to 40:0.9 ($Si_2H_6$: $GeF_4$), a mixture gas of a $Si_2H_6$ gas and a $F_2$ gas, or a mixture gas of $SiH_4$ and $SiF_4$. Note that a semi-amorphous silicon film is preferable since it can have much more crystallinity in a boundary with a base.

A semi-amorphous semiconductor film has a crystal grain of 0.5 to 20 nm at least in a part of a region of the film. A Raman spectrum is shifted to a lower frequency side than 520 $cm^{-1}$ peculiar to a single crystal in a semi-amorphous semiconductor film. In a semi-amorphous semiconductor film, a diffraction peak of (111) or (220) derived from a Si crystal lattice is observed by X-ray diffraction. A semi-amorphous semiconductor film includes hydrogen or halogen of at least 1 atomic % or more to terminate a dangling bond. A semi-amorphous semiconductor film is formed by glow discharge decomposition (a plasma CVD) of a silicon gas. The pressure is in the range of 0.1 to 133 Pa, and a power frequency is 1 to 120 MHz, preferably, 13 to 60 MHz. The heating temperature of a substrate may be 300° C. or less, preferably, 100 to 250° C.

Each concentration of Carbon, Nitrogen, or Oxygen included in an obtained semi-amorphous silicon film is $3 \times 10^{21}/cm^3$ or less, preferably, $3 \times 10^{20}/cm^3$ or less. The concentration of hydrogen included in an obtained semi-amorphous silicon film is $1 \times 10^{21}/cm^3$, which is the same as an amorphous silicon film.

A channel protective film 606 is formed by patterning after forming a conductive film over an entire face of the semiconductor film having a crystal structure. For the patterning, the normal photolithography technique may be employed or the backside exposure using a conductive layer as a mask may be employed to form a resist mask in a self-aligned manner. It is preferable to form the channel protective film 606 by using a dense film, in order to ensure the cleanness in a boundary and to prevent the semiconductor layer from being contaminated with impurities such as an organic matter, a metal, or vapor.

A resist mask is formed with a photo mask to pattern the semiconductor layer. Thus, a semiconductor layer 620 to be an active layer of a TFT is formed by etching.

The resist mask is removed, and then, an amorphous semiconductor film including a one conductive type (n-type or p-type) impurity element is entirely formed in a film thickness of 20 to 80 nm by a known method such as a plasma CVD method or a sputtering method. Note that a semi-amorphous semiconductor film including a one conductive type (n-type or p-type) impurity element may be adopted instead of an amorphous semiconductor film including a one conductive type (n-type or p-type) impurity element. In this embodiment, an amorphous semiconductor film including an n-type impurity element (phosphorus) is used, which is also referred to as an $n^+$ layer (an ohmic contact layer). In this embodiment, an amorphous semiconductor film including a one conductive type (n-type or p-type) impurity element is obtained by using a $SiH_4$ gas, a hydrogen gas, and a $PH_3$ (0.2% dilution) gas as a material gas by a CVD method.

A first conductive film made of a metal material is formed by a sputtering method or a vacuum vapor deposition. Any metal material which can make an ohmic contact to an amorphous semiconductor film including a one conductive type (n-type or p-type) impurity element may be adopted as a material of a first conductive layer; for example, an element selected from Al, Cr, Ta, or Ti; an alloy containing the foregoing element; an alloy film in which the elements are combined; or the like. In this embodiment, a first conductive layer is formed by stacking a Ti film of 50 to 150 nm in film thickness; an aluminum alloy (Al (C+Ni)) of 300 to 400 nm in thickness; and a Ti film of 100 to 150 nm in a thickness.

A resist mask is formed by a photolithography step. Thereafter, wirings 624a, 624b, and 624c, which are formed to be a source wiring or a drain wiring in a later step) are formed by removing an unnecessary part by etching.

A source region or a drain region 621, 622 is formed by etching the amorphous semiconductor film including an impurity element to give one conductive type using the resist mask. In this embodiment, an $n^+$ layer is referred to as a source region or a drain region. Thereafter, the resist mask is removed.

An interlayer insulating film 607 is formed. As the interlayer insulating film 607, a light-transmitting inorganic material (silicon oxide, silicon nitride, silicon oxynitride, or the like); a photosensitive or non-photosensitive organic material (polyimide, acryl, polyamide, polyimide amide, a resist, or benzocyclobutene); a lamination thereof; or the like is employed.

A resist mask is formed by using a photo mask, and an opening (a contact hole) is formed by removing a part of the interlayer insulating film by etching. Note that a base of the opening reaches the wiring 324c.

A second conductive film is formed over an entire surface after removing the resist mask. The second conductive film is patterned using a photo mask, thereby forming a first electrode 608a and 608b. In this embodiment, the first electrode is made of a lamination of a bottom layer 608a made of a reflective metal material (Ag, Al, or the like) and a top layer 608b made of a transparent conductive material (ITO, ITSO, ZnO, $SnO_2$, or the like) is shown.

In addition, a first electrode may be made to be a single layer instead of a lamination. For instance, a first electrode may be a single layer of an Al (C+Ni) alloy film.

According to the above described steps, a bottom gate type (inversely staggered) TFT and a first electrode are formed over the first substrate 601, thereby completing a TFT substrate for a light emitting display panel. In this embodiment, the TFTs 603R, 603G, and 603B are made to be an n-channel type. Therefore, the first electrode preferably functions as a cathode.

A bank 609 is formed so as to cover each edge of the first electrode 608a and 608b. As the bank 609, a photosensitive or non-photosensitive organic material (polyimide, acryl, polyamide, polyimide amide, a resist, or benzocyclobutene) prepared by scattering a black pigment or a SOG film (for example, a SiOx film including an alkyl group) is used in the range of 0.8 to 1 μm in film thickness.

A layer 610 containing an organic compound is formed by a vapor deposition or a coating method using liquid. In this embodiment, a material of the layer 610 containing an organic compound is suitably selected so as to emit white light and each film thickness is also adjusted. The layer 610 containing an organic compound is formed by stacking an EIL (an electron injection layer), an ETL (an electron transport layer), an EML (an emission layer), a HTL (a hole transport layer), and a HIL (a hole injection layer) sequentially over a first electrode (a cathode) side. Note that a layer containing an organic compound can have a single layer structure or a mixed structure aside from a laminated structure.

A transparent electrode 611, that is, an anode of an organic light emitting element, is formed in the range of 10 to 800 nm in film thickness over the layer 610 containing an organic compound. ITO, ITSO, IZO, or the like can be employed for the transparent electrode 611.

A transparent protective film 612 is formed to prevent moisture from intruding by covering a light emitting element. A silicon nitride film, a silicon oxide film, a silicon oxynitride film (a SiNO film (composition ratio N>O) or a SiON film (composition ratio N<O)), a thin film containing carbon as its main component (for example, a DLC film, a CN film), or the like can be used as the transparent protective film 612.

A base layer 613 (also referred to as a buffer layer) containing a photocatalytic material is formed to improve the wettability. A $TiO_2$ crystal having a predetermined crystal structure is formed as a photocatalytic material by a sputtering method.

A second substrate 616 having colored layers 615R, 615G, and 615B is attached to the substrate 601 by using a sealing member including a gap member (such as a filler (a fiber rod) or a particle (a spherical-shaped silica atomy or the like)) for keeping a space between substrates. A space between a pair of substrates is filled with a filler 614, typically, an ultraviolet curing or thermosetting epoxy resin. A glass substrate, a quartz substrate or a plastic substrate with light transparency may be used for the second substrate 616.

As for a light emitting element of this embodiment, the transparent electrode 611, the transparent protective layer 612, the base layer 613 containing a photocatalytic material and the filler 614 are each formed by using a light-transmitting material, and letting in light from a top surface side is possible.

In addition, an active layer of this embodiment is a semi-amorphous silicon film, thus, there is a problem in which off-state current of a TFT is increased in comparison with an amorphous silicon film. Then, a double-gate structure may be adopted for solving the above problem. Note that in this embodiment, a multi-gate structure such as a triple-gate structure may be adopted to reduce variations of off-state current without limiting to a single-gate structure.

In addition, this embodiment can be freely combined with Embodiment Mode or Embodiment 1.

Embodiment 4

In this embodiment, FIGS. 7A to 7I show an example of steps for conducting crystallization using a metal element, oxidation treatment with aqueous solution including an ozone, heat treatment for reducing a distortion, and gettering to obtain a semiconductor layer.

Figure 7A:
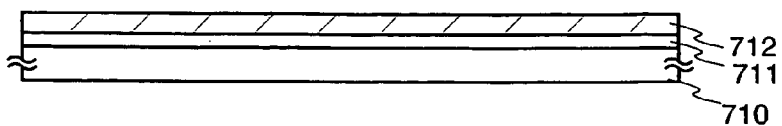
FIGS. 7A to 7I are cross-sectional process drawings (Embodiment 4)

In FIG. 7A, reference number 710 is a substrate having an insulating surface; reference number 711 is a layer to be a blocking layer; and reference number 712 is a first semiconductor film having an amorphous structure.

As shown in FIG. 7A, a base insulating film 711 made of an insulating film such as a silicon oxide film, a silicon nitride film, or a silicon oxynitride film ($SiO_xN_y$) is formed over the substrate 710.

Then, the first semiconductor film 712 having an amorphous structure is formed over the base insulating film. A semiconductor material containing silicon as its main component is employed for the first semiconductor film 712. Typically, an amorphous silicon film, an amorphous silicon germanium film, or the like is employed. The first semiconductor film 712 is formed to be 10 to 100 nm in thickness by a plasma CVD method, a low pressure CVD method, or a sputtering method. In order to obtain a semiconductor layer having a high-quality crystalline structure in a later crystallization, the concentration of impurities such as oxide or nitride contained in the first semiconductor film 712 having an amorphous structure may be reduced to $5 \times 10^{18}/cm^3$ or less (the atomic concentration measured by Second Ion Mass Spectometry (SIMS)). The impurities cause an obstacle to the later crystallization and the density of a trapping center or a recombination center to be increased even after crystallization. Therefore, it is preferable to use a CVD device having a mirror-processed (electrolytic-polishing-processed) reaction chamber and an oil-free vacuum pumping system, enabling to an ultra-high vacuum, in addition to use a high-purity material gas first of all.

The first semiconductor film 712 having an amorphous structure is crystallized by using the technique described in Japanese Patent Application Laid-Open No. 8-78329. As for the technique described the above publication, an amorphous silicon film is selectivity doped with a metal element for promoting the crystallization and heat treatment is conducted, thereby forming a semiconductor film having a crystalline structure which is spread originating from the doped region. The technique has an effect of lowering heating temperature to be required for crystallization and also can enhance the crystal orientation unidirectionally. Forming a TFT by using a semiconductor film having such a crystalline structure enables the electrical characteristics to be significantly improved since electron field-effect mobility is enhanced and the sub-threshold coefficient (S-value) is lowered.

Figure 7B:
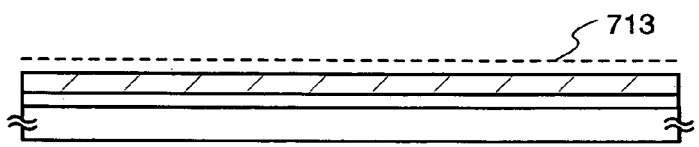

The surface of the first semiconductor film 712 having an amorphous structure is coated with nickel acetate salt solution containing a metal element (here, nickel) with a photocatalytic function for promoting the crystallization of 1 to 100 ppm in weight with a spinner, thereby forming a nickel containing layer 713 (FIG. 7B). A sputtering method, a vapor deposition, or plasma treatment for forming an ultra-thin film may be used instead of the film formation method of the nickel containing layer 713 by a coating method using liquid. In addition, here, an example of coating the entire face with liquid is described; however, a nickel containing layer may be selectively formed by using a mask.

Figure 7C:
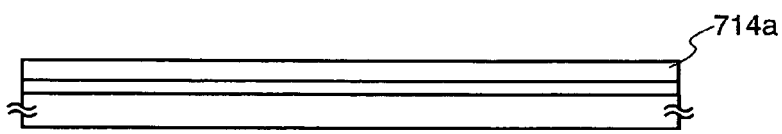

Next, heat treatment is conducted for crystallization. In this case, silicide is formed in a portion of a semiconductor film contacting with a metal element for promoting crystallization of a semiconductor to progress crystallization using the silicide as a core. In this manner, a first semiconductor film 714a having a crystal structure shown in FIG. 7C is formed. Note that the concentration of oxygen included in the first semiconductor film 714a is desirable to be $5 \times 10^{18}/cm^3$ or less after crystallization. Heat treatment (550 to 650° C., for 4 to 24 hours) is performed for crystallization after heat treatment (450° C., for 1 hour) for dehydrogenation. One or a combination of infrared light, visible light, or ultraviolet light can be used when crystallization is conducted by irradiation with intense light. If necessary, heat treatment may be performed for ejecting hydrogen contained the first semiconductor film 714a having an amorphous structure may be conducted before irradiation with intense light. In addition, heat treatment and irradiation with intense light may be simultaneously conducted to be crystallization. In view of the productivity, it is preferable to conduct crystallization by irradiation with intense light.

In the semiconductor film 714a obtained in such a way, a metal element (here, nickel) is remained. The remained metal element is not distributed uniformly in the film; however, it is remained in a concentration exceeding $1 \times 10^{19}/cm^3$, averagely. Each semiconductor element such as a TFT can be formed even in such a state; however, the element is removed by a gettering method described follow.

A natural oxide film to be formed in a crystallization step is removed before the laser irradiation. The natural oxide film is desired to be removed because nickel is included in this natural oxide film in the high concentration.

Figure 7D:
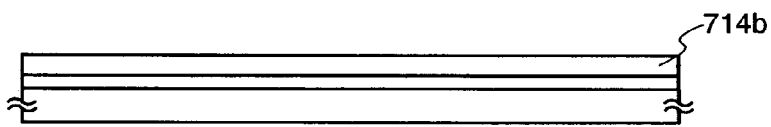

The first semiconductor film having a crystal structure is irradiated with laser light in order to enhance the degree of crystallinity (ratio of crystalline component in the total volume of a film) and in order to repair defects left in crystal grains (FIG. 7D). In the case of the laser irradiation, distortions and ridges are formed in a semiconductor film 714b and a thin surface oxide film (not shown) is formed over the surface. Excimer laser light of 400 nm or less in a wave length emitted from a laser source of a pulse oscillation, a second harmonic wave or a third harmonic wave from a YAG laser may be used as this laser light. A second harmonic wave to a fourth harmonic wave of a fundamental wave may used with a solid state laser capable of a continuous wave as laser light. Typically, a second harmonic wave (532 nm) or a third harmonic wave (355 nm) of Nd:YVO$_4$ laser (a fundamental wave 1064 nm) may be applied.

A surface oxide film formed by the laser irradiation is superior as an oxide film (a barrier layer) to be an etching stopper, since it is harder than an oxide film made of aqueous solution containing ozone. Therefore, a surface oxide film formed by laser light need not be removed particularly since the number of steps can be reduced.

Figure 7E:
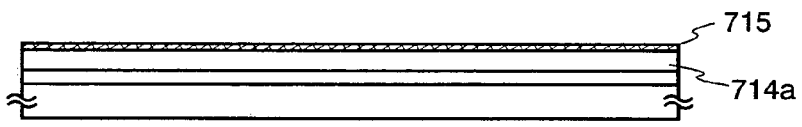

An oxide film (also referred to as a barrier layer) 715 to be an etching stopper by using aqueous solution containing ozone is formed to have a film thickness of 1 to 10 nm over the surface of the semiconductor layer 714a (FIG. 7E).

Figure 7F:
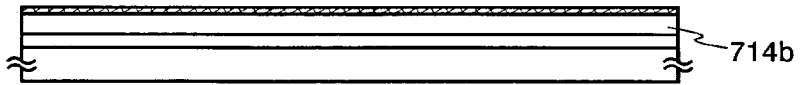

Heat treatment for reducing distortions of a semiconductor layer (heating a semiconductor film to be approximately 400 to 1000° C. by a rapid thermal annealing) is conducted under a nitrogen atmosphere, thereby obtaining the semiconductor film 714b (FIG. 7F).

Figure 7G:
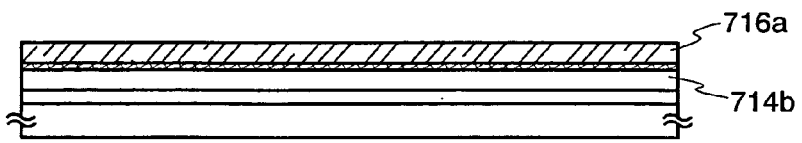

A second semiconductor film 716a containing a rare gas element is formed over this oxide film 715 (FIG. 7G). Note that the rare gas element is one kind or a plurality of kinds selected from He, Ne, Ar, Kr, or Xe. Argon (Ar) that is an inexpensive gas is the most preferable in the productivity. A sputtering method, a plasma CVD method, or the like is employed as the method for forming the second substrate film; however, a plasma CVD method is preferable in the mass productivity since a film formation chamber (also referred to as a chamber) can be cleaned by a gas and thus, the number of maintenances can be reduced as compared with a sputtering method. In this embodiment, an oxide film (a barrier layer) is heated (heating it to be approximately 400 to 1000° C., instantaneously) before/after the film formation of the oxide film to be a harder oxide film, so that a damage caused by plasma is blocked. Distortions or dangling bonds are formed in the oxide film (the barrier layer) by intentionally damaging only the oxide film (the barrier layer) by the plasma in film formation while blocking a first semiconductor film. Thereby, a metal element which moves to relieve distortions can be efficiently passed so as to be moved and trapped into a gettering site. In the case of intentionally damaging only an oxide film (a barrier layer) by the plasma in the film formation, it is preferable to increase the RF power density. For instance, RF power may be 300 W (0.052 W/cm$^2$), or 400 W (0.069 W/cm$^2$) or more.

Figure 7H:

Next, heat treatment is conducted for gettering to reduce the concentration of a metal element (nickel) or remove it in the first semiconductor film (FIG. 7H). The heat treatment for the gettering is performed by irradiation with intense light; heat treatment with a furnace; or heating by introducing a heated gas into the substrate and leaving it for several minutes. This gettering moves a metal element to a direction of arrows shown in FIG. 7H (that is from a substrate side to a second semiconductor film surface), thereby removing a metal element contained in a first semiconductor film 714c covered with the oxide film 715 or reducing the concentration of the metal element.

Next, only a second semiconductor film 716b is selectively removed using the oxide film 715 as an etching stopper. Then, the oxide film 715 is removed.

Figure 7I:
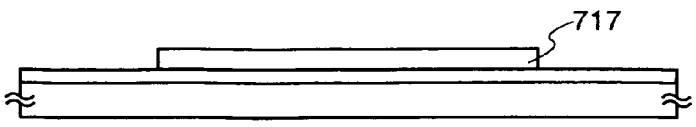

A semiconductor layer 717 is formed to be a desired shape from the first semiconductor film 714c by using a known patterning technique (FIG. 7I). Note that, after removing the oxide film, it is preferable to form a thin oxide film over the surface by using ozone water before a mask made of a resist is formed.

Doping with a minute amount of impurities element (boron or phosphorus) is conducted through the above described oxide film for controlling a threshold value of a TFT before patterning, if necessary. When the doping is performed through the oxide film, the oxide film is removed, and thus, a new oxide film is formed by using aqueous solution containing ozone.

After finishing the step of forming a desired-shaped semiconductor layer, the surface of the semiconductor layer is cleared by using etchant containing hydrofluoric and an insulating film containing silicon as its main component to become a gate insulating film is formed. The surface cleaning and the formation of a gate insulating film are desired to be serially conducted without being exposed to the atmosphere.

In the case of using a crystallization method using a metal element is conducted, the step described in this embodiment is valuable, since gettering is sufficiently not conducted in a substrate and some difference, that is, variations in each TFT characteristic is generated because the gettering is not evenly conducted. A TFT is an essential element for an light emitting device (a light emitting device having an EL element) using a layer containing an organic compound as a light emitting layer, in realizing an active matrix driving method. Therefore, at least, a TFT which functions as a switching element and a TFT which supplies current to an EL element are disposed in each pixel, in a light emitting device using an EL element. The luminance of a pixel is decided by on-state current ($I_{on}$) of a TFT which is electrically connected to the EL element and supplies current to an EL element, irrespective with a circuit configuration and a driving method of a pixel. Therefore, when white is displayed on an entire face, a problem in which variations of the luminance are generated is caused, if the on-state current is not constant.

For instance, after the laser irradiation, heating treatment for reducing distortions of a semiconductor film is conducted, and thus, an oxide film of total 1 to 10 nm may be formed by using aqueous solution containing ozone, without being limited to the step sequence shown in FIGS. 7A to 7I. Heating treatment for reducing distortions of the semiconductor film is conducted again before removing the oxide film, and thus, the oxide film later formed may be removed.

Alternatively, after the laser irradiation, a patterning step of a semiconductor film; a heating treatment step of reducing distortions of the semiconductor film; a step of forming an oxide film to have a thickness of 1 to 10 nm in total by using aqueous solution containing ozone; and a step of removing the oxide film may be sequentially conducted. Note that a gate insulating film may be formed without removing the oxide film to reduce the number of steps.

Alternatively, after the laser irradiation, a patterning step of a semiconductor film; a step of forming an oxide film to have a thickness 1 to 10 nm by using aqueous solution containing ozone; a heating treatment step of reducing distortions of a semiconductor film; and a step of removing an oxide film may be sequentially conducted. Note that a gate insulating film may be formed without removing an oxide film for reducing the number of steps.

In addition, this embodiment can be freely combined with any one of Embodiment Mode or Embodiments 1 to 3.

Embodiment 5

In this embodiment, a structure of a pixel of an EL display panel is described with reference to an equivalent circuit diagram shown in FIGS. 8A to 8F.

Figure 8A:
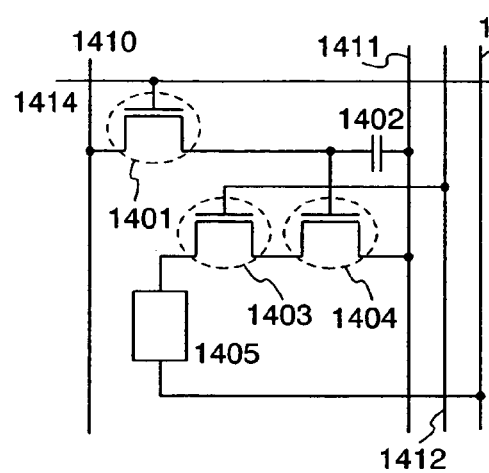
FIGS. 8A to 8F are circuit diagrams showing a structure of each pixel applicable to an EL display panel according to the invention (Embodiment 5)

A pixel shown in FIG. 8A has a signal line 1410 and power supply lines 1411 to 1413 which are disposed in columns, and has a scanning line 1414 which is disposed in rows. It also has a switching TFT 1401, a driving TFT 1403, a current-controlling TFT 1404, a capacity element 1402, and a light emitting element 1405.

Figure 8B:
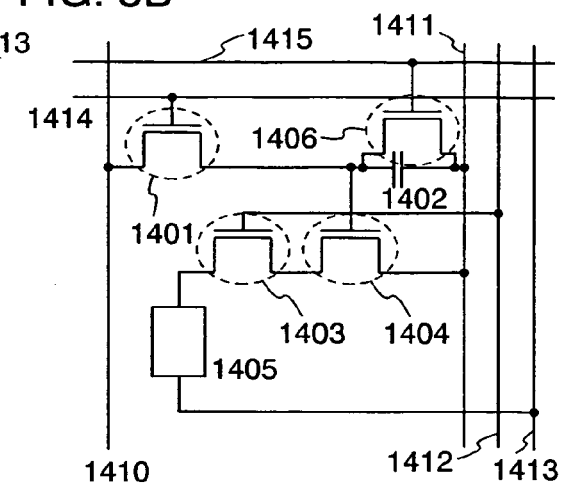
Figure 8C:
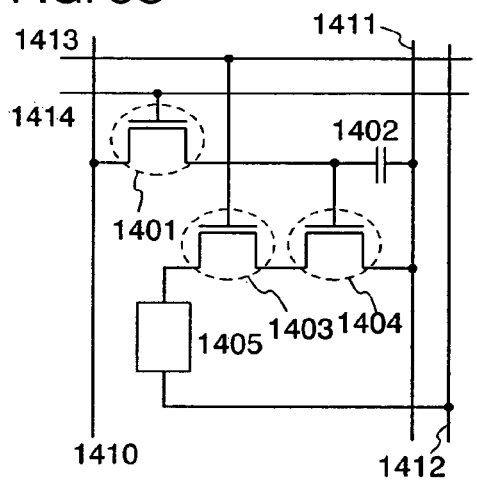

A pixel shown in FIG. 8C is different from in FIG. 8A in connecting a gate electrode of the TFT 1403 to the power supply line 1413 disposed in rows; however, they are the same in a further point of the structure. In other words, both pixels shown in FIGS. 8A and 8C indicate the same equivalent circuit diagram. Each power supply line is formed over an insulating film in the case of disposing the power supply line 1412 in rows (FIG. 8A) from in the case of disposing the power supply line 1412 in columns (FIG. 8C). The embodiment focuses on a wiring to be connected to a gate electrode of a driving TFT 1403 and each pixel is shown separately into FIG. 8A and in FIG. 8C to show the difference in the layers in which each power supply line is formed.

As characteristics of each pixel shown in FIGS. 8A and 8C, the TFT 1403 is serially connected to the TFT 1404; and the channel length $L_3$ and the channel width $W_3$ of the TFT 1403 and the channel length $L_4$ and the channel width $W_4$ are set to be $L_3/W_3 : L_4/W_4 = 5$ to $6000:1$. As an example of satisfying the above characteristic, $6000:1$, $L_3$ is 500 µm; $W_3$ is 3 µm; $L_4$ is 3 µm; and $W_4$ is 100 µm.

Note that the TFT 1403 operates in a saturation region and functions as control on the current value in passing current to a light emitting element 1405; and the TFT 1404 operates in a linear region and functions as control on the current supply to the light emitting element 1405. It is preferable in view of a manufacturing process that each TFT has the same conductive type. Not only an enhancement type but also a depletion type may be employed for the TFT 1403. Slight variations in $V_{gs}$ of the TFT 1404 have no influence on the current value of the light emitting element 1405. In other words, the current value of the light emitting element 1405 is decided by the TFT 1403 which operates in a saturation region. The invention having the above described structure can provide a display device with an enhanced image quality by improving the uneven luminance of a light emitting element resulting from variations in properties of a TFT.

In each pixel shown in FIGS. 8A to 8D, the TFT 1401 controls an input of a video signal to a pixel. The TFT 1401 is turned on and a video signal is input into a pixel to hold the video signal in the capacity element 1402. Note that in FIGS. 8A and 8C, the capacity element 1402 is each shown; however, without specifically limiting to it, when a gate capacity or the like can be adopted as a capacity for holding a video signal, the capacity element 1402 need not be shown specifically.

Figure 8D:
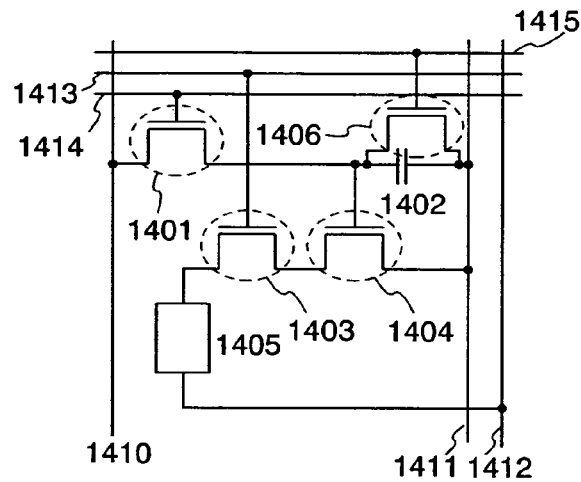

A pixel shown in FIG. 8B is different from in FIG. 8A in adding the TFT 1406 and a scanning line 1415 thereto; however, they are the same in a further point of the structure. In the same manner, a pixel shown in FIG. 8D is different from in FIG. 8C in adding the TFT 1406 and the scanning line 1415 thereto; however, they are the same in a further point of the structure.

The on/off of the TFT 1406 is controlled by the scanning line 1415. The TFT 1406 is turned on, and then an electric charge held in the capacity element 1402 is discharged to turn off the TFT 1406. In other words, the flow of an electric current to the light emitting element 1405 can be forcibly prevented by disposing the TFT 1406. In each structure of FIGS. 8B and 8D, a lighting period can be started simultaneously with or just after starting a writing period without waiting for writing each signal into all pixels, so that a duty factor can be improved.

Figure 8E:
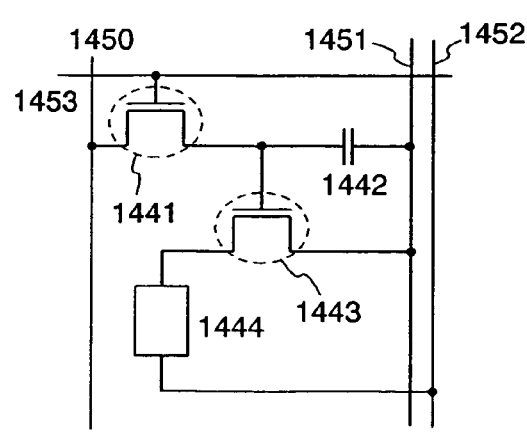
Figure 8F:
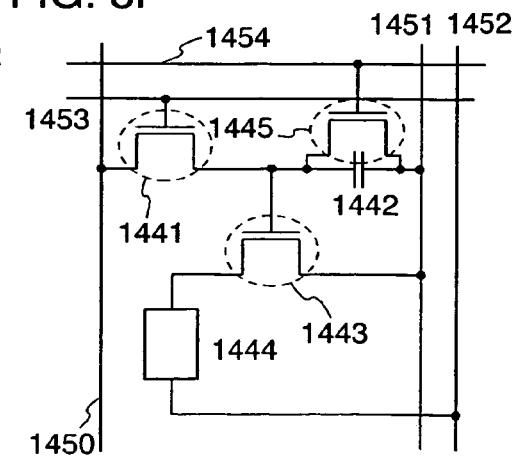

A pixel shown in FIG. 8E has a signal line 1450 and power supply lines 1451 and 1452 which are disposed in columns, and has a scanning line 1453 which is disposed in rows. It also has a switching TFT 1441, a driving TFT 1443, a capacity element 1442, and a light emitting element 1444. A pixel shown in FIG. 8F is different from in FIG. 8E in adding a TFT 1445 and a scanning line 1454 thereto; however, they are the same in a further point of the structure. In the structure of FIG. 8F, a duty factor can be also improved by disposing the TFT 1445.

This embodiment can be freely combined with any one of Embodiment Mode and Embodiments 1 to 4.

Embodiment 6

In this embodiment, an embodiment of mounting an FPC or a driving IC on an EL display to be manufactured by using the above described embodiment is described.

Figure 9A:
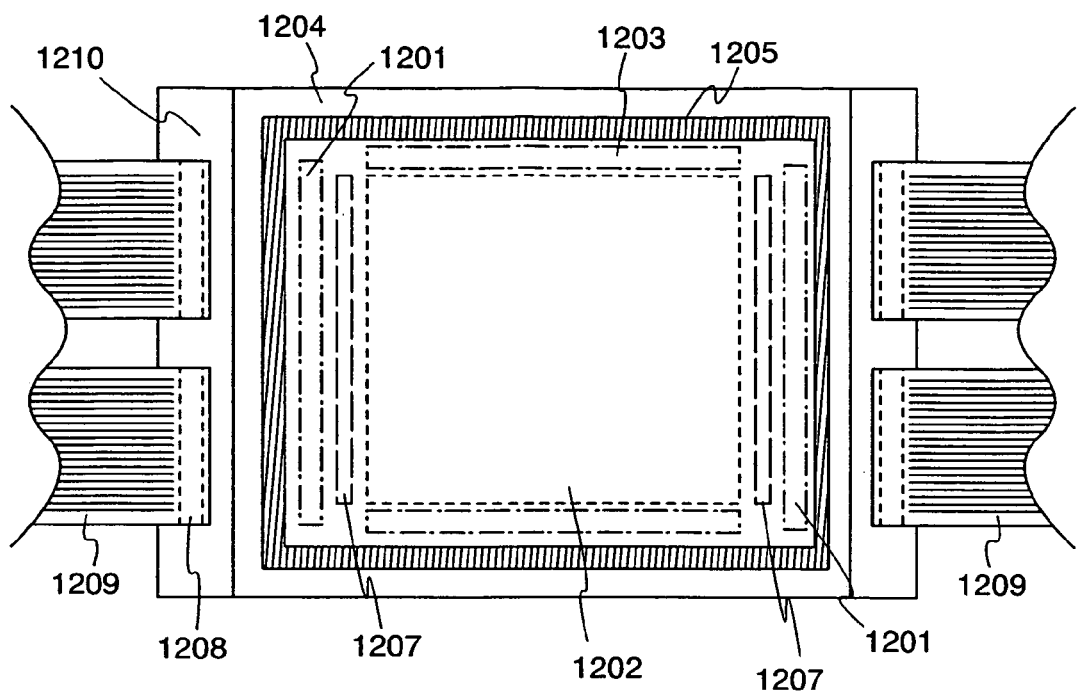
FIGS. 9A and 9B are top views of each EL display panel (Embodiment 6)

FIG. 9A is an example showing a top view of a light emitting device in which each FPC 1209 is attached to four terminal portions 1208. Over a substrate 1210, a pixel portion 1202 including a light emitting element and a TFT, a gate-side driving circuit 1203 including a TFT and a source-side driving circuit 1201 including a TFT are formed. These circuits can be formed over the same substrate when an active layer of a TFT is constructed from a semiconductor layer having a crystal structure. Therefore, an EL display panel in which the system-on-panel is realized can be manufactured.

Note that a portion of the substrate 1210 except a contact portion is covered with a protective film and a base layer containing a photocatalytic material is disposed over the protective film.

Two connecting regions 1207 disposed so as to sandwich a pixel portion are disposed for contacting a second electrode of a light emitting element to a bottom wiring. Note that a first electrode of a light emitting element is electrically connected to a TFT disposed in a pixel portion.

A sealing substrate 1204 is fixed to the substrate 1210 by a sealing member 1205 surrounding the pixel portion and the driving circuit and by a filler surrounded with the sealing member. In addition, it is possible to be filled with a filler including a transparent desiccate. A desiccate may be disposed in a region which is not overlapped with a pixel portion.

Figure 9B:
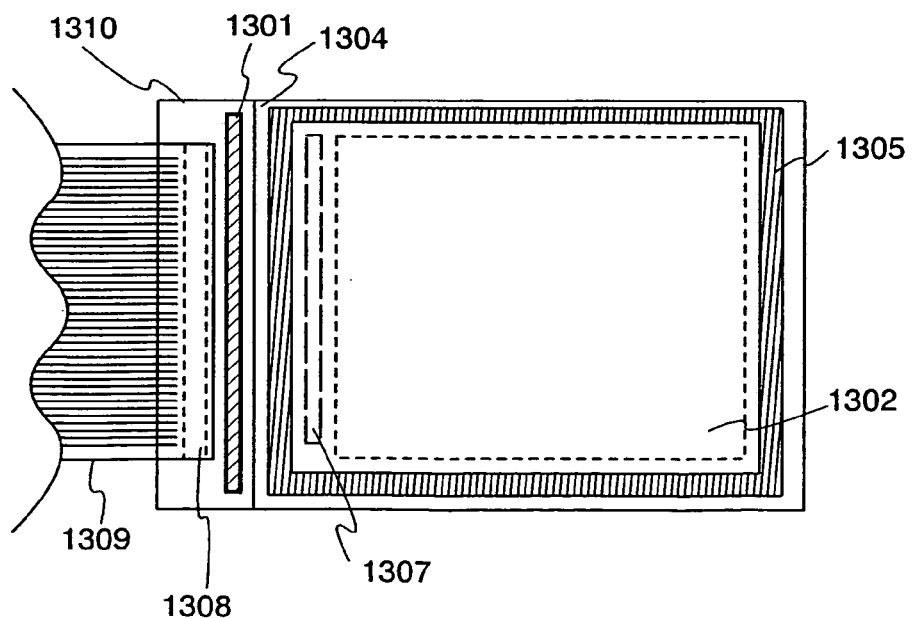

A structure shown in FIG. 9A is suitable for a light emitting device of a relatively large size of XGA class (for instance, the opposite angle: 4.3 inches). In FIG. 9B, a COG mode which is suitable for a light emitting device of a small size (for instance, the opposite angle: 1.5 inches) is adopted.

A driving IC 1301 is mounted over a substrate 1310 and an FPC 1309 is mounted over a terminal portion 1308 disposed in the end of the driving IC, in FIG. 9B. A plurality of the driving ICs 1301 to be mounted are preferably formed over a rectangular substrate to be 300 mm to 1000 mm or more in one side, from a view point of improving the productivity. In other words, a plurality of circuit patterns having a driving circuit portion and an input/output terminal as a unit are formed over a substrate, and lastly it may be divided to be taken out. The driving IC may be formed to be rectangular in a longer side of 15 to 80 mm and in a shorter side of 1 to 6 mm, or may be formed to have a length of a longer side which is a length of one side of a pixel region or a length adding one side of a pixel portion to one side of each driving circuit.

The driving IC is favorable in external dimensions since a longer side can be made in an IC chip. When a driving IC formed to be 15 to 80 mm in a longer side is used, the number of driving ICs to be required for being mounted to a pixel portion is reduced, compared with the case of using an IC chip, thereby improving the yield in manufacturing. When a driving IC is formed over a glass substrate, the productivity is not deteriorated since there is no limitation in the shape of a substrate used as a parental body. This is a big advantage in compared with a case of taking out an IC chip from a circular silicon wafer.

In addition, a TAB mode may be adopted, and in this case, a plurality of tapes are attached and a driving IC may be mounted to the tapes. As in a case of the COG mode, a driving IC may be mounted on a tape; in this case, a metal piece or the like for fixing a driving IC is preferably attached jointly for the intensity.

The substrate except for a contact portion is covered with a protective film, and a base layer containing a photocatalytic material is disposed over the protective film.

A connecting region 1307 disposed between a pixel portion 1302 and the driving IC 1301 is disposed for contacting a second electrode of a light emitting element to a bottom wiring. Note that a first electrode of a light emitting element is electrically connected to a TFT disposed in a pixel portion.

A sealing substrate 1304 is fixed to the substrate 1310 by a sealing member 1305 surrounding the pixel portion 1302 and by a filler surrounded with the sealing member.

In the case of using an amorphous semiconductor film as an active layer of a TFT, the structure shown in FIG. 9B is adopted even in a big size, since it is difficult to form a driving circuit over the same substrate.

The adhesion of a sealing member, an FPC, or a driving IC is improved since a base layer containing a photocatalytic material is formed over a protective film.

In addition, this embodiment can be freely combined with any one of Embodiment Mode and Embodiments 1 to 5.

Embodiment 7

As display devices and electronic appliances, there is an example such as a video camera, a digital camera, a goggle-type display (a head-mount display), a navigation system, a sound reproducer (a car audio, an audio composition, or the like), a laptop computer, a game instrument, a personal digital assistance (a mobile computer, a portable-phone, a portable game instrument, electronic book, or the like), or an image reproduction device with a recording medium (specifically, a device including a display which can display an image by reducing a recording medium such as Digital Versatile Disc (DVD)). Specific examples of such electronic appliances are shown in FIGS. 10A to 10D and 11A to 11E.

Figure 10A:
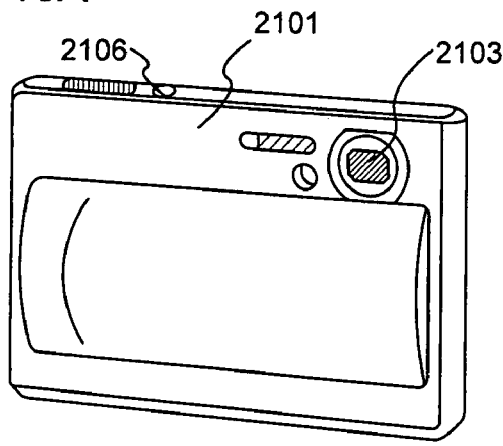
FIGS. 10A to 10D show each example of electronic devices (Embodiment 7)
Figure 10B:
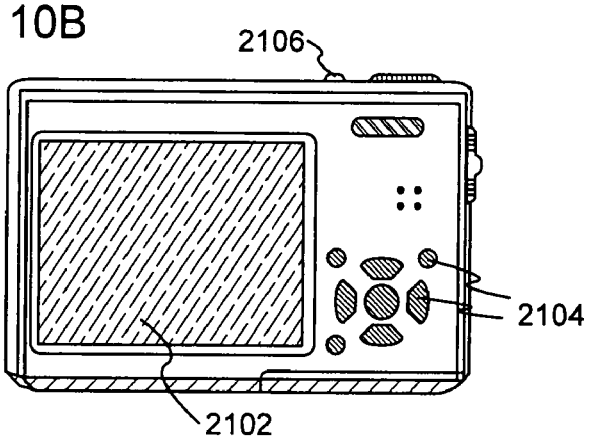

FIGS. 10A and 10B show a digital camera, which includes a main body 2101, a display portion 2102, an imaging portion 2103, operation keys 2104, a shutter 2106, or the like. The invention makes it possible to realize a digital camera having a full-color display portion 2102 enabling a well-contrast display.

Figure 10C:
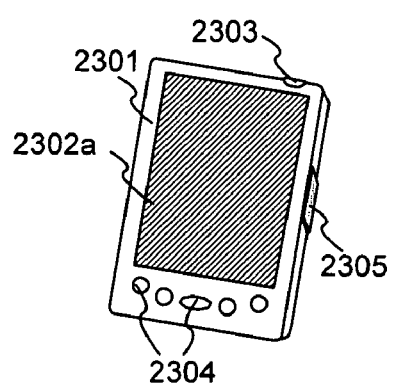
Figure 10D:
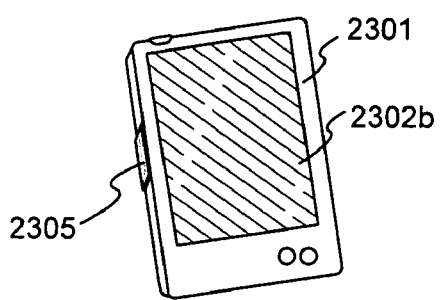

FIG. 10C is a perspective view of a mobile computer, and FIG. 10D is a perspective view showing a back side of the mobile computer. The mobile computer includes a main body 2301, display portions 2302a and 2302b, a switch 2303, operation keys 2304, an infrared radiation port 2305, or the like. The display portions 2302a and 2302b are dual-light-emitting panels. The display portion 2302a displays mainly full-color images and high definition images in one face of one panel, and the display portion 2302b displays mainly characters and symbols in monochrome in another face of one panel. The invention makes it possible to realize a mobile computer having a full-color display portion 2302a enabling well-contrast display. Note that the dual light-emitting panels can be manufactured by using Embodiment 2. One face is shown in a monochrome display as shown in FIG. 10D when a colored layer is disposed only in the other face; however, both faces can be shown in full-color if disposing a colored filter.

Figure 11A:
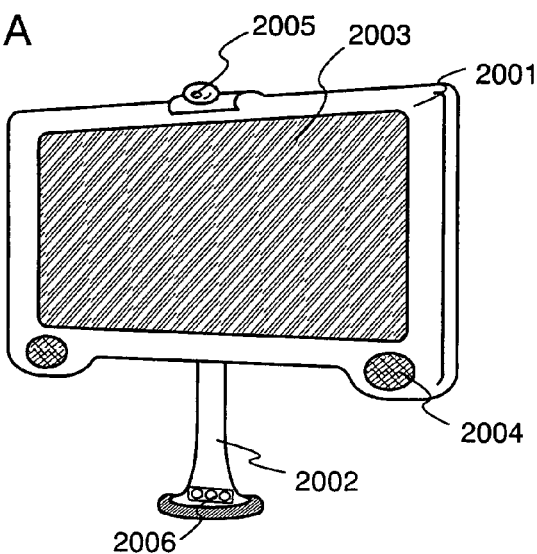
FIGS. 11A to 11E show each example of electronic devices (Embodiment 7).

FIG. 11A is a large-sized display device including a large screen of 22 to 50 inches, which includes a chassis 2001, a support 2002, a display portion 2003, a speaker 2004, an imaging portion 2005, a video input terminal 2006, or the like. Note that the display device includes every display device for an information display, for example, for a personal computer, for TV broadcast reception, or the like. The invention makes it possible to complete a large-sized full-color display device enabling well-contrast display.

Figure 11B:
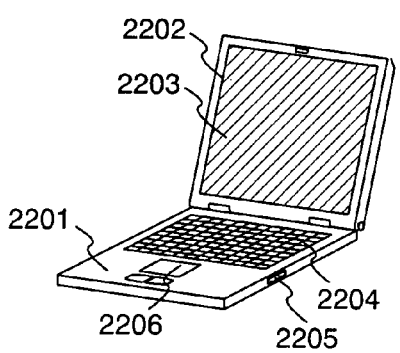

FIG. 11B shows a laptop computer, which includes a main body 2201, a chasses 2202, a display portion 2203, a keyboard 2204, an external-connection port 2205, a pointing mouse 2206, or the like. The invention makes it possible to complete a full-color laptop computer enabling well-contrast display.

Figure 11C:
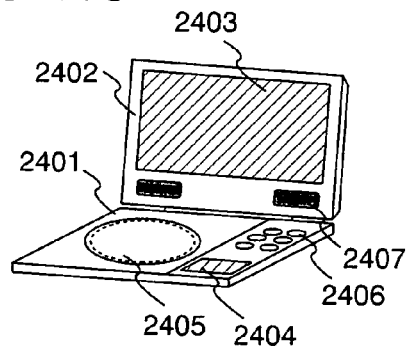

FIG. 11C shows a mobile image reproduction device with a recording medium (specifically, a DVD reproducing device), which includes a main body 2401, a chassis 2402, a display portion A 2403, a display portion B 2404, a recording medium (DVD or the like) a reading portion 2405, operation keys 2406, a speaker portion 2407, or the like. The display portion A 2403 mainly displays image information, and the display portion B 2404 mainly displays character information. Note that the video reproduction device includes a household game instrument or the like. The invention makes it possible to complete a full-color image reproducing device enabling well-contrast display.

Figure 11D:
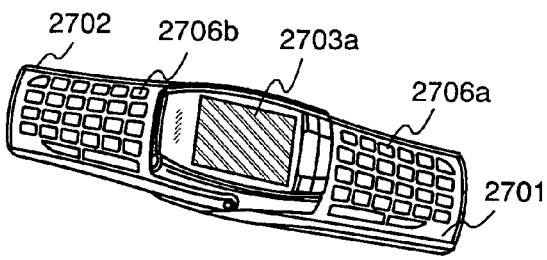
Figure 11E:
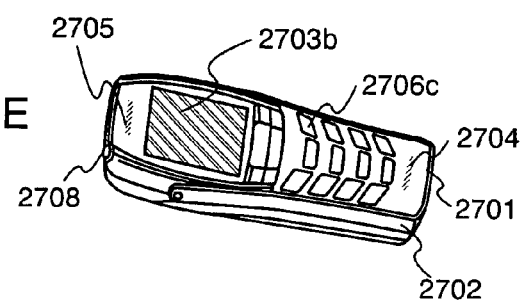

FIG. 11D is a perspective view of a personal digital assistance, and FIG. 11E is a perspective view showing a state of using it as a folding portable-phone. In FIG. 11D, users operate operation keys 2706a with their right fingers and operate operation keys 2706b with their left fingers, as a keyboard. The invention makes it possible to complete a full-colored personal digital assistance enabling well-contrast display.

As shown in FIG. 11E, in folding a portable telephone, users have a main body 2701 and a chassis 2702 in one hand and use a voice input portion 2704, operation keys 2706c, an antenna 2708, or the like.

The personal digital assistance shown in FIGS. 11D and 11E each includes a display portion 2703a which horizontally displays mainly images and characters to be high definition and a display portion 2703b which vertically displays.

As described above, several electronic appliances can be completed by using a manufacturing method or a structure of any one of Embodiment Mode or Embodiments 1 to 6.

The invention make it possible to simplify a structure on a sealing substrate side of a light emitting device enabling a full-color display and a manufacturing method thereof. In addition, the quantity of a filler between a pair of substrates can be reduced by narrowing a space between the substrates.

This application is based on Japanese Patent Application serial no. 2004-112801 filed in Japan Patent Office on Apr. 7, 2004, the entire contents of which are hereby incorporated by reference.

What is claimed is:

1. A light emitting device comprising:
a plurality of pixels formed over a substrate, each of the plurality of pixels comprising a light emitting element including a first electrode, a second electrode and an organic compound layer interposed therebetween;
a protective film over the light emitting element;
a layer containing a photocatalytic material formed over the protective film; and
a layer comprising resin formed over the layer containing the photocatalytic material,
wherein the protective film comprises at least one selected from the group consisting of a SiN film, a SiNO film, a DLC film, a CN film, an amorphous carbon film, and a metal oxide film.

2. A light emitting device comprising:
a plurality of pixels formed over a substrate, each of the plurality of pixels comprising a light emitting element including a first transparent electrode, a second transparent electrode and an organic compound layer interposed therebetween;
a protective film over the light emitting element;
a layer containing a photocatalytic material formed over the protective film; and
a layer comprising resin formed over the layer containing the photocatalytic material,
wherein the protective film comprises at least one selected from the group consisting of a SiN film, a SiNO film, a DLC film, a CN film, an amorphous carbon film, and a metal oxide film.

3. A light emitting device comprising:
a plurality of pixels formed over a substrate, each of the plurality of pixels comprising a light emitting element including a first electrode, a second electrode and an organic compound layer interposed therebetween;
a bank containing a light shielding material and covering an end portion of the first electrode;
a protective film over the light emitting element;
a layer containing a photocatalytic material formed over the protective film; and
a layer comprising resin formed over the layer containing the photocatalytic material,
wherein the protective film comprises at least one selected from the group consisting of a SiN film, a SiNO film, a DLC film, a CN film, an amorphous carbon film, and a metal oxide film.

4. A light emitting device comprising:
a plurality of pixels formed over a substrate, each of the plurality of pixels comprising a light emitting element including a first transparent electrode, a second transparent electrode and an organic compound layer interposed therebetween;
a bank containing a light shielding material covering an end portion of the first transparent electrode;
a protective film over the light emitting element;
a layer containing a photocatalytic material formed over the protective film; and
a layer comprising resin formed over the layer containing the photocatalytic material,
wherein the protective film comprises at least one selected from the group consisting of a SiN film, a SiNO film, a DLC film, a CN film, an amorphous carbon film, and a metal oxide film.

5. A light emitting device comprising:
a plurality of pixels formed over a first substrate, each of the plurality of pixels comprising a light emitting element including a first electrode, a second electrode and an organic compound layer interposed therebetween;
a bank containing a light shielding material and covering an end portion of the first electrode;
a protective film over the light emitting element;
a layer containing a photocatalytic material formed over the protective film;
a filler in contact with the layer containing the photocatalytic material;
a second substrate opposed to the first substrate, wherein the second substrate has at least one colored layer,
wherein the protective film comprises at least one selected from the group consisting of a SiN film, a SiNO film, a DLC film, a CN film, an amorphous carbon film, and a metal oxide film.

6. A light emitting device comprising:
a plurality of pixels formed over a first substrate, each of the plurality of pixels comprising a light emitting element including a first transparent electrode, a second transparent electrode and an organic compound layer interposed therebetween;
a bank containing a light shielding material covering an end portion of the first transparent electrode;
a protective film over the light emitting element;
a layer containing a photocatalytic material formed over the protective film;
a filler in contact with the layer containing the photocatalytic material;
a second substrate opposed to the first substrate, wherein the second substrate has at least one colored layer,
wherein the protective film comprises at least one selected from the group consisting of a SiN film, a SiNO film, a DLC film, a CN film, an amorphous carbon film, and a metal oxide film.

7. The light emitting device according to any one of claims 1, 3 and 5, wherein the first electrode comprises a light-reflective material.

8. The light emitting device according to any one of claims 1, 3 and 5, wherein the first electrode comprises a lamination of a transparent conductive material and a light-reflective material.

9. The light emitting device according to any one of claims 1, 3 and 5, further comprising a light-shielding interlayer insulating film between the first substrate and the first electrode.

10. The light emitting device according to claim 5 or 6, wherein the bank is partially overlapped with the at least one colored layer.

11. The light emitting device according to claim 5 or 6, wherein a dimension of the at least one colored layer is larger than that of a light emitting region surrounded with the bank.

12. The light emitting device according to claim 5 or 6, wherein the at least one colored layer is red, green or blue.

13. The light emitting device according to any one of claims 1 to 6, wherein the photocatalytic material comprises at least one selected from the group consisting of titanium oxide ($TiO_x$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), ferric oxide ($Fe_2O_3$), and tungsten oxide ($WO_3$).

14. The light emitting device according to any one of claims 1 to 6 wherein the first electrode is electrically connected to a thin film transistor.

15. The light emitting device according to any one of claims 1 to 4 wherein the resin comprises an ultraviolet curing or a thermosetting epoxy resin.

16. The light emitting device according to any one of claims 1 to 4 further comprising an opposite substrate opposed to the substrate.

17. The light emitting device according to claim 5 or 6, wherein the filler comprises an ultraviolet curing or a thermosetting epoxy resin.

18. The light emitting device according to any one of claims 1 to 6, wherein the light emitting device has an electrode or a wiring which contains an aluminum alloy which includes carbon and nickel.

19. The light emitting device according to any one of claims 1 to 6, wherein the light emitting element emits white light.

20. The light emitting device according to any one of claims 1 to 6, wherein the light emitting device is incorporated in at least one selected from the group consisting of a video camera, a digital camera, a personal computer, a mobile computer, a portable telephone, and a personal digital assistance.

21. The light emitting device according to any one of claims 1 to 6, wherein the light emitting device is incorporated in a screen of a television device.

* * * * *